(12) United States Patent
Sepulveda et al.

(10) Patent No.: US 11,791,566 B2
(45) Date of Patent: Oct. 17, 2023

(54) EXTREMELY ELECTRICALLY SMALL ANTENNAS BASED ON MULTIFERROIC MATERIALS

(71) Applicant: THE REGENTS OF THE UNIVERSITY OF CALIFORNIA, Oakland, CA (US)

(72) Inventors: Abdon E. Sepulveda, Los Angeles, CA (US); Gregory P. Carman, Los Angeles, CA (US); Jinzhao Hu, Los Angeles, CA (US); Joseph Devin Schneider, Los Angeles, CA (US); Elmer Wu, Rowland Heights, CA (US); Zhi Yao, Los Angeles, CA (US); Sidhant Tiwari, Riverside, CA (US); Wenzhong Yan, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 228 days.

(21) Appl. No.: 17/168,048

(22) Filed: Feb. 4, 2021

(65) Prior Publication Data

US 2021/0242606 A1 Aug. 5, 2021

Related U.S. Application Data

(63) Continuation of application No. PCT/US2019/045865, filed on Aug. 9, 2019.
(Continued)

(51) Int. Cl.
*H01Q 3/44* (2006.01)
*H01Q 21/06* (2006.01)
*H03H 9/22* (2006.01)

(52) U.S. Cl.
CPC ............ *H01Q 21/067* (2013.01); *H01Q 3/44* (2013.01)

(58) Field of Classification Search
CPC .......... H01Q 1/38; H01Q 7/06; H01Q 21/06; H01Q 21/067; H01Q 3/44; H01Q 9/04;
(Continued)

(56) References Cited

U.S. PATENT DOCUMENTS 4,425,554 A * 1/1984 Morishita ............... H03H 9/25
                                                    333/195
8,803,751 B1 * 8/2014 Miller ..................... H01Q 7/06
                                                    343/787
(Continued)

FOREIGN PATENT DOCUMENTS

WO 2020101773 A2 5/2020

OTHER PUBLICATIONS

ISA/US, United States Patent and Trademark Office, International Search Report and Written Opinionn dated May 12, 2020, related PCT international application No. PCT/US2019/045865, pp. 1-10, claims searched, pp. 11-15.

*Primary Examiner* — Tho G Phan
(74) *Attorney, Agent, or Firm* — O'BANION & RITCHEY LLP; John P. O'Banion

(57) ABSTRACT

A multiferroic antenna apparatus and method are described which provides increased energy efficiencies and ease of implementation. Magnetoelastic and/or magnetostrictive resonator are coupled to a piezoelectric substrate, along with electrodes coupled to its opposing surfaces. In receive mode the resonators create mechanical waves in response to being excited into magnetic oscillation by receiving electromagnetic radiation, and these mechanical waves coupled to the piezoelectric substrate causing it to generate an electrical output signal at said electrodes. In transmit mode an electrical signal coupled through the electrodes induces
(Continued)

mechanical waves in the piezoelectric substrate directed to the resonators which are excited into magnetic oscillation to output electromagnetic waves.

16 Claims, 10 Drawing Sheets

Related U.S. Application Data

(60) Provisional application No. 62/880,513, filed on Jul. 30, 2019, provisional application No. 62/716,936, filed on Aug. 9, 2018.

(58) Field of Classification Search
CPC ...... H01Q 9/0407; H01Q 11/02; H01Q 13/10; H03H 9/02228; H03H 9/17; H03H 9/175; H03H 9/173; H03H 9/22; H03H 9/25
See application file for complete search history.

(56) References Cited

U.S. PATENT DOCUMENTS

| | | | |
|---|---|---|---|
| 9,660,349 B2* | 5/2017 | Keller | H03H 9/25 |
| 10,218,072 B2* | 2/2019 | Wang | H01Q 1/52 |
| 10,541,474 B2* | 1/2020 | Arfaei Malekzadeh | H01Q 1/38 |
| 10,601,400 B1* | 3/2020 | McConney | H03H 9/14514 |
| 11,271,295 B1* | 3/2022 | Selvin | H03C 7/02 |
| 11,563,420 B1* | 1/2023 | Kubena | H10N 35/101 |
| 2012/0212375 A1 | 8/2012 | Depree, IV | |
| 2016/0380357 A1 | 12/2016 | Keller | |
| 2017/0146618 A1 | 5/2017 | Leese De Escobar | |
| 2017/0346149 A1 | 11/2017 | Ciubotaru | |
| 2018/0115070 A1 | 4/2018 | Wang | |

* cited by examiner

EXTREMELY ELECTRICALLY SMALL ANTENNAS BASED ON MULTIFERROIC MATERIALS

CROSS-REFERENCE TO RELATED APPLICATIONS

This application claims priority to, and is a 35 U.S.C. § 111(a) continuation of, PCT international application number PCT/US2019/045865 filed on Aug. 9, 2019, incorporated herein by reference in its entirety, which claims priority to, and the benefit of, U.S. provisional patent application Ser. No. 62/716,936 filed on Aug. 9, 2018, incorporated herein by reference in its entirety, and which also claims priority to, and the benefit of, U.S. provisional patent application Ser. No. 62/880,513 filed on Jul. 30, 2019, incorporated herein by reference in its entirety. Priority is claimed to each of the foregoing applications.

The above-referenced PCT international application was published as PCT International Publication No. WO 2020/101773 A2 on May 22, 2020, which publication is incorporated herein by reference in its entirety.

STATEMENT REGARDING FEDERALLY SPONSORED RESEARCH OR DEVELOPMENT

This invention was made with government support under Grant Number 1160504, awarded by the National Science Foundation, and Grant Number FA9550-16-C-0029, awarded by the U.S. Air Force, Office of Scientific Research. The government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to electrically small antennas, and more particularly to surface acoustic wave (SAW) multiferroic antennas, bulk acoustic wave (BAW) multiferroic antennas, shear-horizontal (SH) wave multiferroic antennas and lamb wave multiferroic antennas.

2. Background Discussion

Conventional antennas rely on electrical currents oscillating to generate electromagnetic radiation at radio frequencies into free space. However, a conventional antenna exhibits low radiating capability when placed near a conductive plane due to a platform effect. At the same time, when made into a small size, the antenna will have significantly higher Ohmic losses. This is due to the effect that as the physical dimensions are reduced, the device resistance increases.

Recently, research into the field of multiferroic magnetoelectric composite structures have gained attention due to their energy efficiency and wide application area. However, these multiferroic antenna designs still have issues in attaining practical levels of energy efficiency and ease of manufacture when implementing physical real-life antenna arrays.

Accordingly, a new multiferroic antenna structure is needed which is readily manufactured that overcomes energy efficiency issues. The present disclosure fulfills that need and provides additional advantages of existing technology.

BRIEF SUMMARY

The technology described in this disclosure generally pertains to radio frequency antennas, and more particularly, to a mechanical mediated multiferroic antenna for radio frequencies. Multiferroic antennas include the subclass of surface acoustic wave (SAW) antennas, bulk acoustic wave (BAW) antennas, shear-horizontal (SH) wave antennas and lamb wave antennas that radiate or receive radio frequencies using a nano/micro-scale structure.

A new multiferroic antenna is described which uses dynamic magnetic flux current oscillations as the fundamental source for detecting or radiating EM waves. An aspect of the technology is to provide a new path to couple mechanical waves, which are mainly but not limited to mechanical waves, with EM waves.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

1. Introduction

Figure 1:
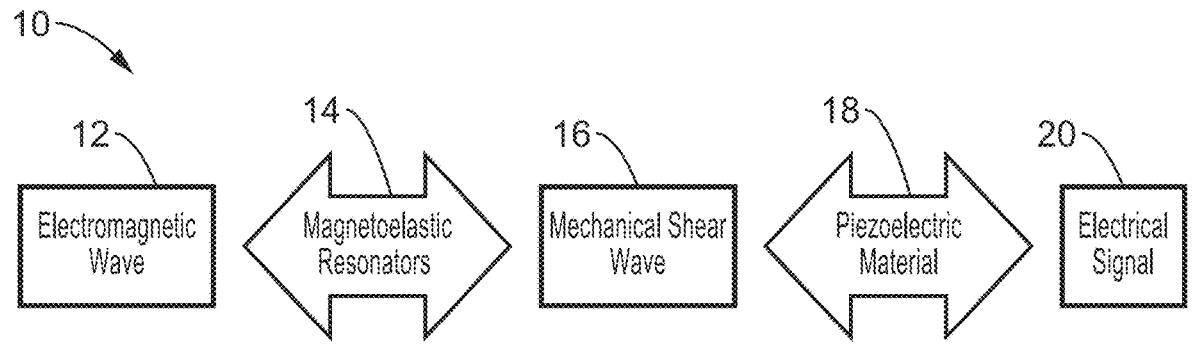
FIG. 1 is a block diagram illustrating the operation of a multiferroic antenna according to an embodiment of the present disclosure.

An antenna is described, by way of example and not limitation, which relies on magnetoelastic and/or magnetostrictive resonators to transmit electromagnetic waves through dynamic strain, or to receive electromagnetic waves when such a dynamic strain is induced on a piezoelectric substrate. The magnetoelastic and/or magnetostrictive resonators can only transfer certain frequency EM waves into mechanical vibrations related to their natural frequency of resonance. The size, shape, and distance relationship between the resonator and its receiver/detector electrode determine the resonant parameters, which are conditions for peak voltage detection. A feature of this antenna is that the resonators are in the same plane with the electrode detectors, but in a different plane with the ground electrode. The electrical field is applied out-of-plane and the strength of such a field is detected through measuring the induced voltage. In this way, the energy loss will be reduced, and the signal will be more efficiently detected.

To overcome issues associated with conventional antennas, the present disclosure utilizes a magnetic current instead of an electrically conductive current. In one embodiment, an antenna according to the present disclosure comprises resonators comprising magnetoelastic/magnetostrictive materials (which can include Ni, Co, Fe), alloy (which may include FeGaB, CoFe, NiFe, CoNi, FeNiCo, CoNiFe, Metglas, FeSi, CoSiB, Galfenol, FeCoSiB, CoFeB, TbFe$_3$, TbFe$_2$, DyFe$_2$, Terfenol-D, CoFe, AlFe, CoCrPt, CoCr, CoCrB, FeCrB, Fe$_3$O$_4$, CoFe$_2$O$_4$, MnZnFe$_2$O$_4$, NiFe$_2$O$_4$, Y$_3$Fe$_5$O$_{12}$, YIG, NiZnFeO, MnNiZnFe or FeCoSiB) or composites (which can include FeGa/NiFe multilayers). The present disclosure is not limited to the above materials or combinations thereof, as other materials and combinations can exhibit similar properties. It should be appreciated that Magnetostrictive materials are ferromagnetic materials that change shape in response to application of a magnetic field, and that Magnetoelastic materials change their elastic properties and extension in response to application of a magnetic field. The technology is applicable to antennas in general and is not limited by the size, shape or distance relationship between the resonator and the corresponding electrode detectors.

In at least one embodiment the presented technology is an electrically small antenna that utilizes magnetoelastic and/or magnetostrictive material as resonators to create mechanical waves that include, but are not limited to, shear waves, shear-horizontal wave and lamb wave across a piezoelectric substrate, which by way of example and not limitation may comprise Lithium Niobate, Quartz, Aluminum Nitride (AlN), PZT, ZnO, LiTaO or PMN-PT, or other materials which produce an electrical signal. In at least one embodiment, the magnetoelastic/magnetostrictive resonators are coupled with a piezoelectric substrate as well as an electrode detector fabricated from conductive materials, such as Gold, Silver, Copper, Aluminum or other suitable conductor.

It should be appreciated that the phrasing "and/or" is used herein to indicate elements A and B, or either element A or B; and if more than two elements are described then it indicates A and B and C, any of these elements separately, or any combination of A, B and C.

The magnetoelastic/magnetostrictive resonators perform as a source to excite the mechanical wave through the piezoelectric substrate while the electrode structures act as a detector to measure the mechanical wave-induced electrical field. The structure, as a whole, can be used to convert electromagnetic radiation into an electric signal, or vice versa to convert electrical signals into electromagnetic radiation.

Accordingly the present disclosure provides for transmitting or receiving electromagnetic (EM) radiation with extremely electrically small structures. The receiving process can be generally described as follows: (1) an EM wave comes from free space; (2) the EM wave excites magnetic oscillation in magnetoelastic material; (3) the magnetoelastic material islands mechanically oscillate and launch mechanical waves in the piezoelectric substrate; (4) The piezoelectric substrate transduces the shear wave or other potential mechanical wave into voltage changes; and (5) the voltage is measured with an optimized electrode design and output to a grounded coplanar waveguide.

The transmitting process is the converse of the above, as follows: (1) voltage is applied to an optimized electrode design; (2) a piezoelectric substrate transduces the applied voltage changes into a shear wave or other potential mechanical wave; (3) mechanical waves in the piezoelectric substrate reach the magnetoelastic material islands which mechanically oscillate; (4) mechanical oscillation in the magnetoelastic material generate electromagnetic waves (EM); (5) EM waves are launched into free space.

Further aspects of the technology described herein will be brought out in the following portions of the specification, wherein the detailed description is for the purpose of fully disclosing preferred embodiments of the technology without placing limitations thereon.

The geometry of the resonators (size and shape) as well as the architecture of the array (e.g., spacing between resonators and distance between resonators and electrodes, and can include different architectures for each row of the resonator array) are determined by maximizing the output voltage, while global optimization is performed toward avoiding poor local maxima.

Acoustic energy reflecting components can be potentially used in this structure. The acoustic energy reflecting components include, but are not limited to, Bragg acoustic mirror and acoustic gratings. More particularly, a Bragg acoustic mirror is a set of multilayers formed by different material with different acoustic impedance. In a Bragg mirror, the thickness of each layer is designed to be $\lambda/4$ where $\lambda$ is the wavelength of a longitudinal wave or shear wave in the corresponding layer. Acoustic gratings are a set of comb-shaped structures of elongated strips that are formed by one material or different materials. The width of each grating and the distance between different grating elements can be λ/4 or λ/2. Typical materials which can be utilized for acoustic energy reflecting components include but are not limited to Al, W, AlN, $SiO_2$, Si, SiN, and Mo. The energy reflecting components may also comprise trenches or air cavities surrounding the multiferroic antenna.

The transduction process in receiving mode is detailed as follows. (1) An electromagnetic wave reaching the device results in a magnetic flux and/or current applied to the magnetoelastic or magnetostrictive resonators. (2) The applied flux and/or current then causes the resonator to oscillate accordingly. (3) Surface resonator oscillations excite a mechanical wave, which substantially comprises, but is not limited to, a shear wave across the thickness of a piezo electric substrate. (4) These mechanical waves create an oscillating voltage difference between the top surface, upon which the electrode detector rests, and the bottom surface that is grounded. (5) The frequency of both the mechanical wave and the resulting oscillating electric potential matches the frequency of the initial electromagnetic wave. (6) The above process can also be reversed, starting with the electric potential and ending with the radiated electromagnetic wave.

By way of example and not limitation, the following describes a specific design example, implemented for a frequency of 300 MHz and utilizing rectangular shaped resonators. In this example, the material of the design is Nickel (Ni) for the resonators, Gold (Au) for the electrodes, and Lithium Niobate (LiNbO3) for the piezoelectric substrate. It will be appreciated, however, that this disclosure is not limited to the specific example with its described shape, size, area, thickness, applicable bandwidth, other structural features and design criterion, but the present disclosure is applicable to all multiferroic antennas based on the presented technology. The described design procedure can easily accommodate a range of forcing frequencies and combination of materials.

A key aspect of the technology, which allows for reducing antenna size, is the ability to transfer an electromagnetic wave from free space into a transmissible mechanical wave. It will be recognized that for the same given frequency the wavelength of the mechanical wave will be hundreds of times smaller than the original electromagnetic wave, thus allowing it to be detected by a structure many times smaller than a standard antenna.

2. Multiferroic Antenna Embodiments

FIG. 1 illustrates an example embodiment 10 of the transduction process of the multiferroic antenna according to the present disclosure. The electromagnetic (EM) waves 12 excite the magnetic flux oscillating within the magnetoelastic-material-based resonators 14. The resonators that are patterned on the piezoelectric substrate (e.g., the top of substrate) will also mechanically oscillate 16 due to the magnetoelastic effect. A mechanical wave is also induced across the piezoelectric substrate 18 that is attached to the resonator. Because of the piezoelectric effect, the substrate will transfer the mechanical wave to an electrical signal 20 through a voltage difference. This process is reversible, which means this antenna can both receive and radiate an EM wave signal.

Figure 2:
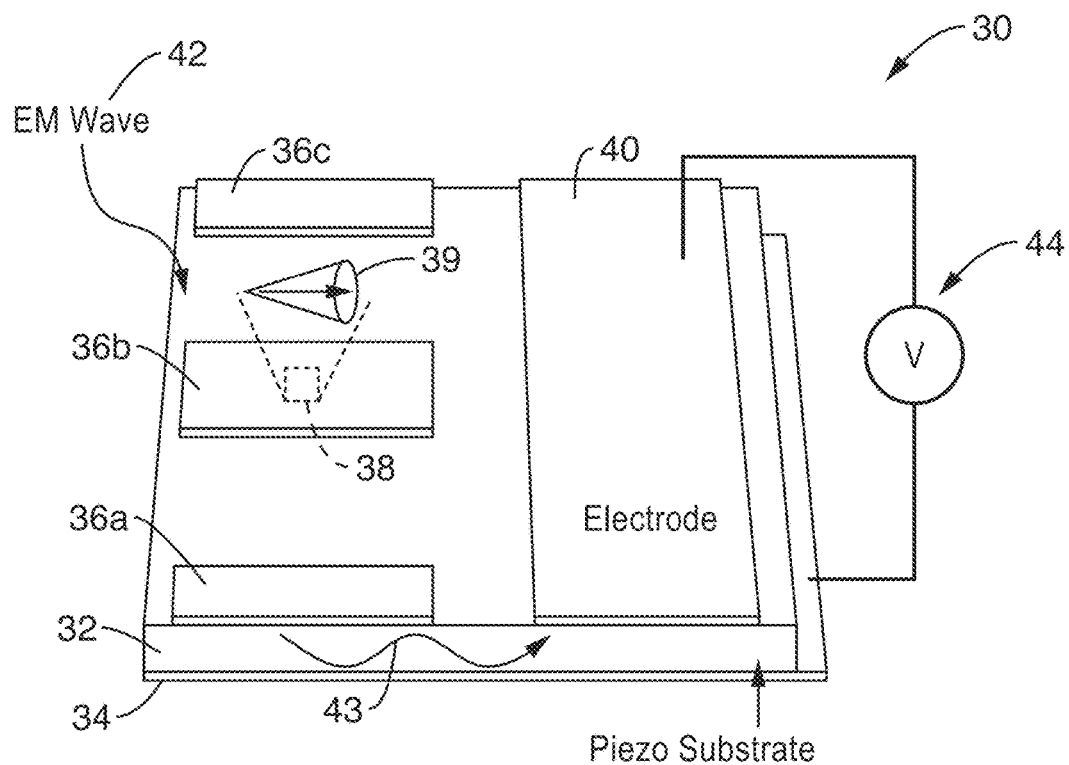
FIG. 2 is a schematic showing the relationship of the EM wave, resonators and electrodes in a multiferroic antenna according to an embodiment of the present disclosure.

FIG. 2 illustrates an example embodiment 30 of a multiferroic antenna array. A piezoelectrical substrate 32 has a ground electrode 34 on a first surface (e.g., on the bottom surface). On the opposing surface (e.g., top surface) are depicted magnetoelastic-material-based resonators 36a, 36b, 36c (also referred to as magnetic islands in FIG. 6) and one or more detecting electrodes 40 as well are deposited and patterned. Cone 39 is a schematic representation of magnetization oscillation in the region of square 38 which represents part of a magnetoelastic resonator. A voltage source/sink is depicted connected between the electrode(s) 40 and ground electrode 34. It should be appreciated that the figures only depict a representative portion of a multiferroic antenna array, however, the size of the components and the distances between the components can be varied in response to the use of different materials, operating frequency or other design criterion without departing from the teachings of the present disclosure.

In FIG. 2 is also shown the working principle of this antenna with an EM wave 42 shown reaching resonators 36a through 36c, resulting in a wave created by the resonators and then transferred 43 through the piezoelectric substrate 32. Next, the piezoelectric substrate translates the mechanical wave into an out-of-plane voltage signal 44, which is captured by electrodes on the top surface 40 as well as the ground electrodes on the bottom surface 34. Any desired plurality of these multiferroic antenna structures can be placed adjacent to one another, such as in a periodic form, to implement a multiferroic antenna array to attain a desired level of radiation power/signal strength. One of the principle advantages of the present disclosure in relation with conventional magnetoelastic frequency antennas is the signal strength. This presented technology relies on the out-of-plane electrical field and mechanical wave, which allows the detection electrodes to be positioned in close proximity to the magnetoelastic/magnetostrictive resonators. The short distance avoids the energy loss through the transfer process and the interference between different resonators, while allowing large scale integrated antenna arrays to be fabricated.

Figure 3:
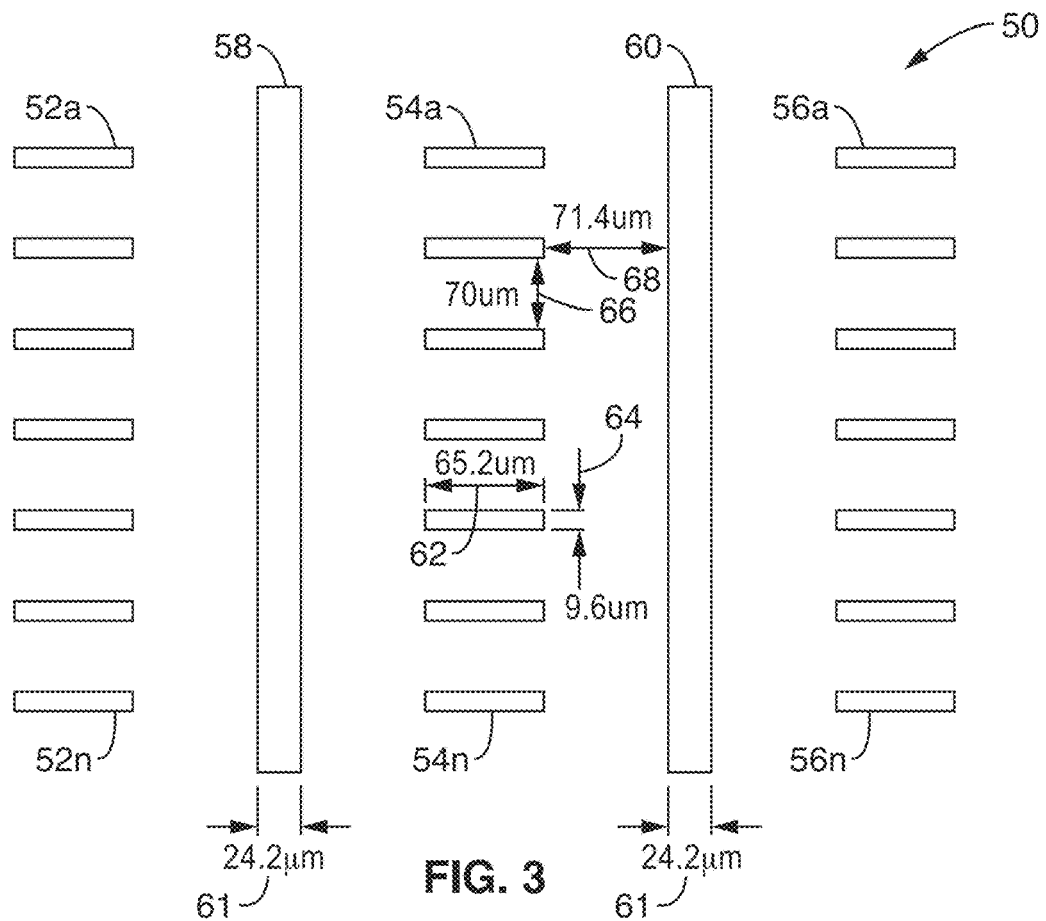
FIG. 3 is a schematic showing geometry and dimensions of electrode and resonator elements in a multiferroic antenna according to an embodiment of the present disclosure.

FIG. 3 illustrates an example embodiment 50 of a pattern of electrodes and resonators for the exemplified multiferroic antenna. Rows of resonators are shown 52a through 52n, 54a through 54n and 56a through 56n, with one row between each pair of electrodes 58, 60. The conductive electrodes 58, 60 are exemplified as being fabricated from Gold/Au and having a width 61 of 24.2 μm, the dimensions for the resonators (e.g., from Nickel/Ni material) are exemplified as having a width 62 of 65.2 μm and height 64 of 9.6 μm with a thickness of 250 nm. In this example, the resonator-to-resonator spacing 66 is 70 μm, with the resonator-to-electrode spacing 68 exemplified as 71.4 μm. There is only one row of resonators between two detector electrodes.

Toward accommodating different applications, operating frequencies and materials, the width and length of the resonators as well as the spacing between different components can range from, but is not limited to, a size range from about 1 μm to about 100 μm. The thickness of the resonators can range from, but is not limited to, a size range from about 10 nm to about 2 μm. In at least one multiferroic antenna embodiment, different resonators (e.g., differing in size, shape and material) can be employed for expanding the operating bandwidth, increasing signal strength or for other purposes. The piezoelectric material may comprise any suitable material such as z-cut Lithium Niobate. The thickness of the piezoelectric substrate in this example embodiment is approximately 100 μm. However, the thickness for the disclosed technology can range from, but is not limited to, approximately 10 nm to about 2 mm. The fabrication process can be, but is not limited to photolithography, lift off, e-beam evaporation or magnetic control sputtering in a cleanroom.

Figure 4:
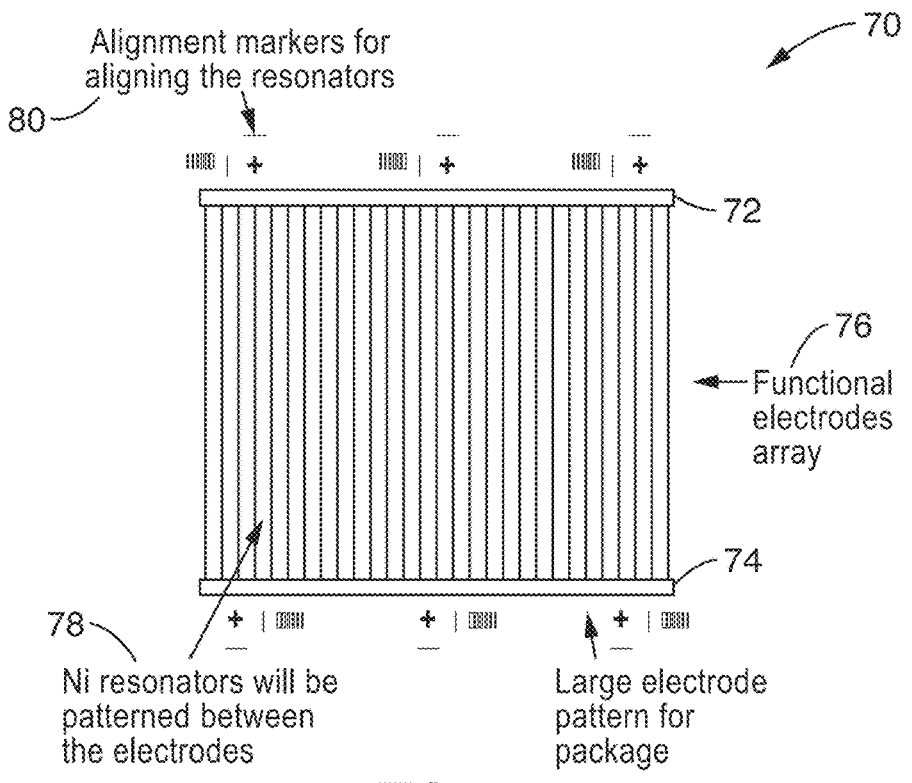
FIG. 4 is a schematic showing the structure of the electrode array in a multiferroic antenna implemented according to an embodiment of the present disclosure.

FIG. 4 illustrates an example embodiment 70 of an electrode array depicted in plan view. The width of the functional electrodes 76 is designed for optimum impedance matching to the feed circuit, while the gap between the electrodes is designed to maximize signal strength. The relative position 78 of the resonators (not seen due to small size in this depiction) is optimized, designed and determined after the electrode array is fixed. The functional electrodes are connected by the package electrodes 72, 74 on the side, which connects the device to the feed circuit through bonding wires. The figure also depicts the use of alignment markers 80 for aligning the resonators.

Figure 5:
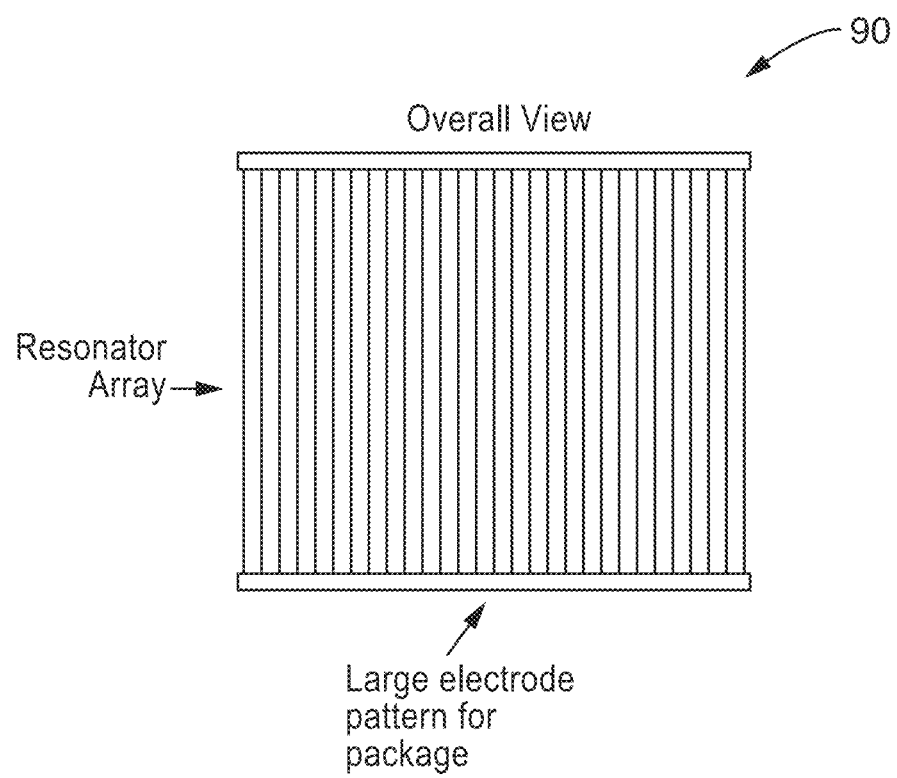
FIG. 5 is a schematic showing the structure of a multiferroic antenna array according to an embodiment of the present disclosure.

FIG. 5 illustrates an example embodiment 90 of the antenna, depicted in plan view. Resonators are patterned between the electrodes. Every single resonator as well as the adjacent electrodes comprise a singular small antenna, an antenna array is deployed to increase the signal strength and includes redundancy to accommodate fabrication tolerances. Different levels of signal strength can be obtained by antenna arrays spanning any desired amount of surface area.

Figure 6:
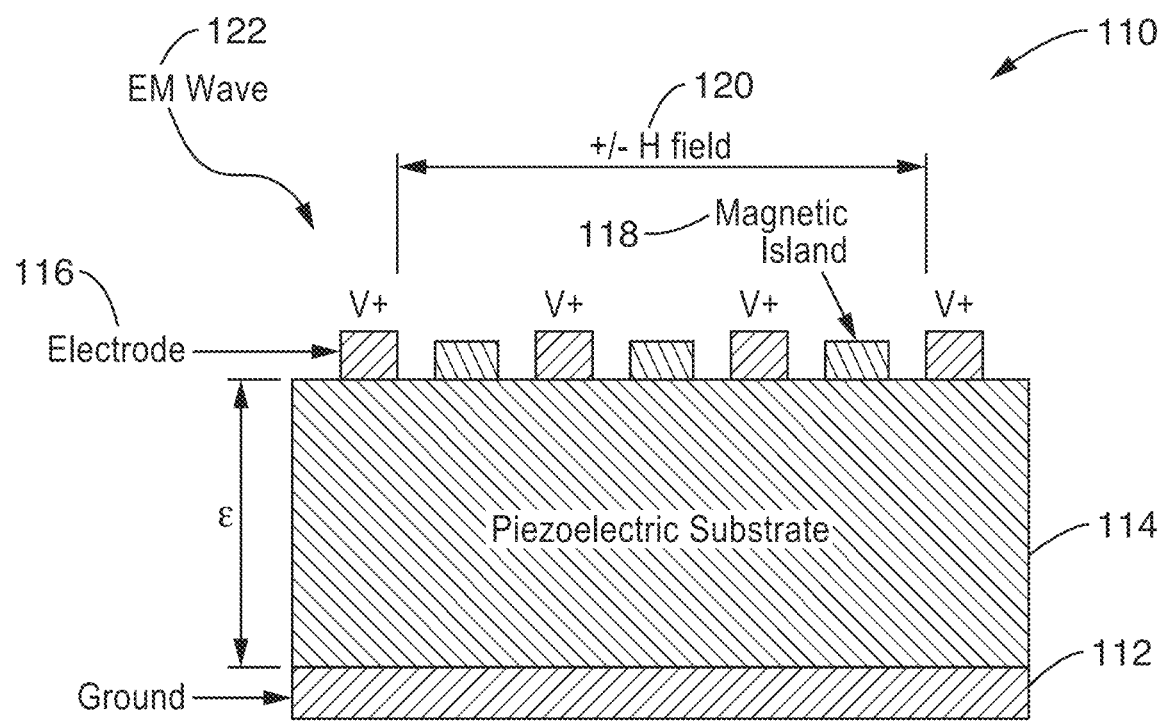
FIG. 6 is a schematic cross-sectional view of the multiferroic antenna shown in FIG. 5 according to an embodiment of the present disclosure.

FIG. 6 illustrates an example multiferroic antenna embodiment 110 which corresponds to a portion of FIG. 5. A ground electrode 112 is seen beneath piezoelectric substrate 114, over which are electrodes 116 and magnetic islands 118. Induced or sensed EM wave 122 and magnetic field area (+/−H field) 120 for sensing/generating the EM wave are also shown in the figure.

Figure 7A:
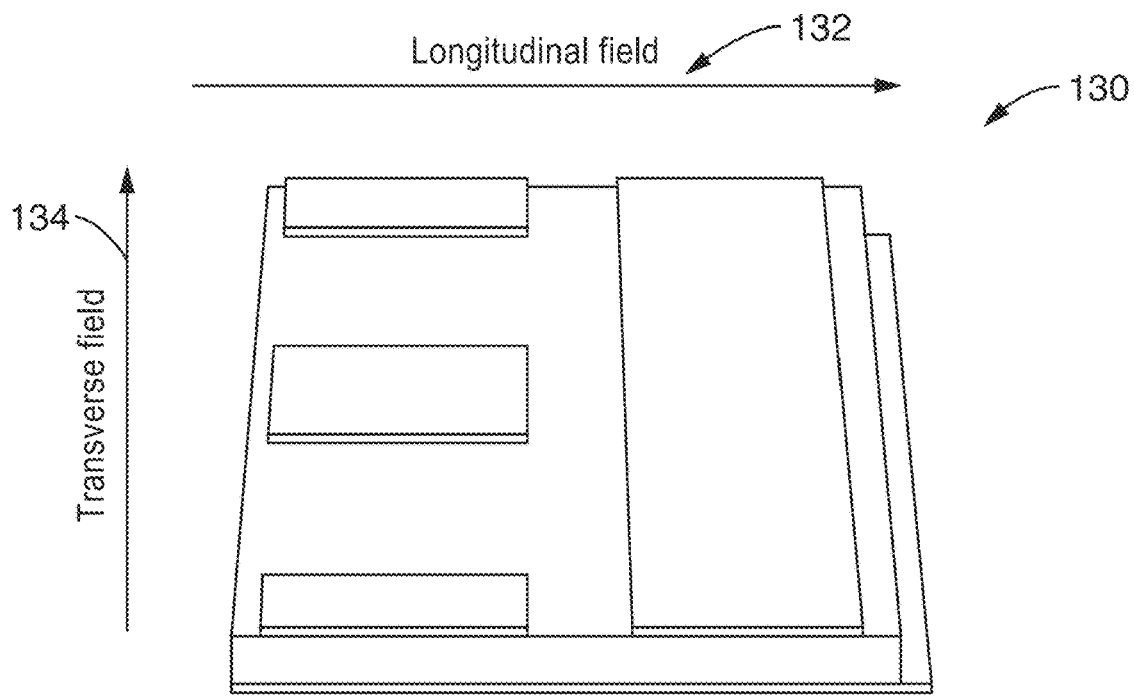
FIG. 7A through 7C are a schematic and test results for a multiferroic antenna implemented according to an embodiment of the present disclosure.
Figure 7B:
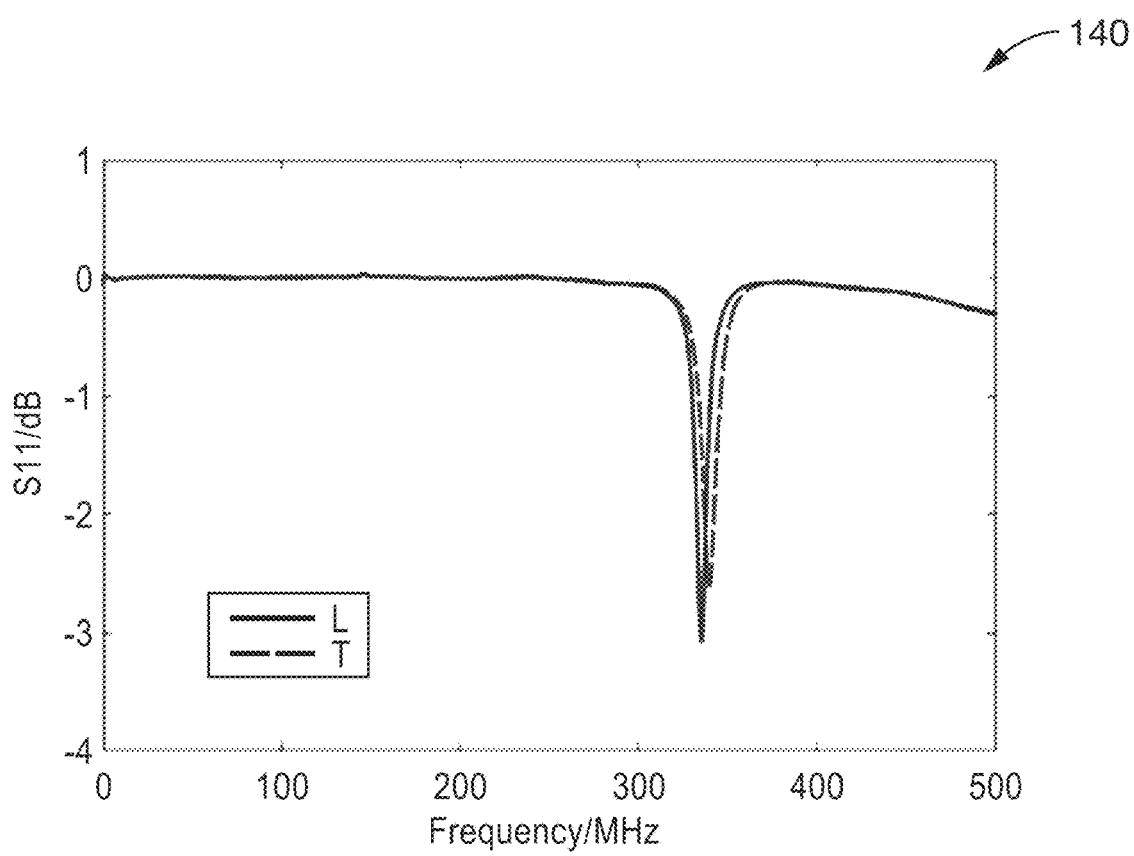
Figure 7C:
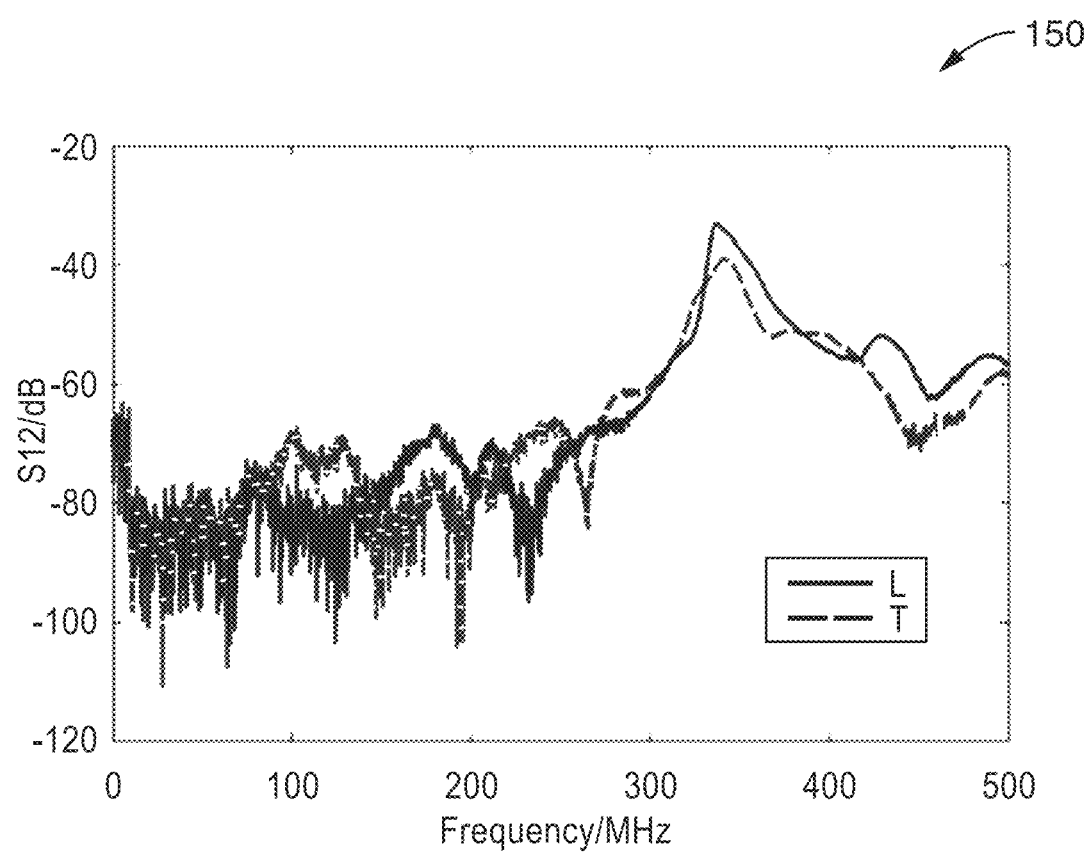

FIG. 7A through FIG. 7C illustrate an example embodiment of an antenna 130 and associated preliminary test results 140, 150. In the antenna shown in FIG. 7A, the longitudinal field 132 and transverse field 134 signals were measured, in this example using an Agilent® N5230C PNA-L Network Analyzer. In this test, the transmitting antenna was a loop antenna, with a diameter of approximately 3 cm, and the antenna was the multiferroic antenna under test (AUT), with size about 7×5 mm². In this example the longitudinal field is the preferred field, since the field direction tends to align the magnetization in the magnetoelastic resonators, providing improved resonant performance. S11 in FIG. 7B depicts return loss of the AUT, while S12 in FIG. 7C shows the ratio between the received power to the transmitted power. If the field is aligned in the longitudinal direction the signal will be at its highest. If the field is transverse, the material will be stiffer. The resulting frequency will be higher, and the signal will be weaker. These results confirm that the produced signal is due to the magnetoelastic effect of the antenna array described in the present disclosure.

As can be seen, the presented technology is a new multiferroic antenna based on a mechanical/shear wave. With this technology, the size of the singular small antenna can be created with dimensions approximately 1/10000 of the wavelength (λ). The size of the antenna, and/or array of antennas, can be scaled such as to under 1/100λ to reach a practical signal strength for a given application. This multiferroic antenna is suitable for, but not limited to, applications for military (e.g., approximately 200 MHz to 300 MHz) or medical (e.g., approximately 400 MHz) devices. In view of its small scale, this antenna can be implanted into various types of medical equipment. The ability to provide relatively low frequency operation ensures the signal can safely pass through organic tissues. The antenna of the present disclosure, however, can be configured for any desired frequency range as its geometric dimensions, shape or other parameters, as well as the design of electrodes can be readily changed.

3. Multiferroic Antenna Enhanced by Energy Reflecting Components

Based on a mechanical wave resonator, previously designed multiferroic antennas have high energy dissipation making it difficult to attain a signal strength which is useful for practical applications. In this disclosure energy reflecting components are harnessed, such as acoustic Bragg mirrors, acoustic gratings, trenches and air cavities, to confine the energy and form standing waves to strengthen resonator vibrations, and alternatively to enhance radiated signal strength as well.

Figure 8:
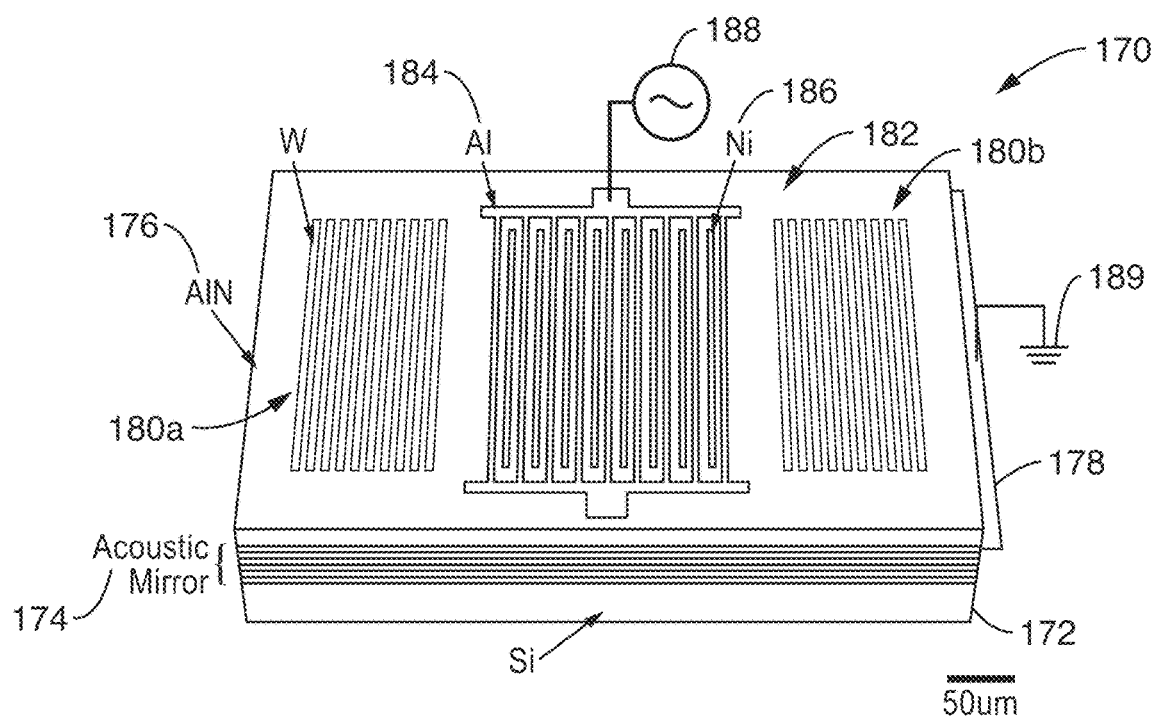
FIG. 8 is a schematic of a shear-horizontal (SH) wave or lamb wave multiferroic antenna according to an embodiment of the present disclosure.
Figure 9:
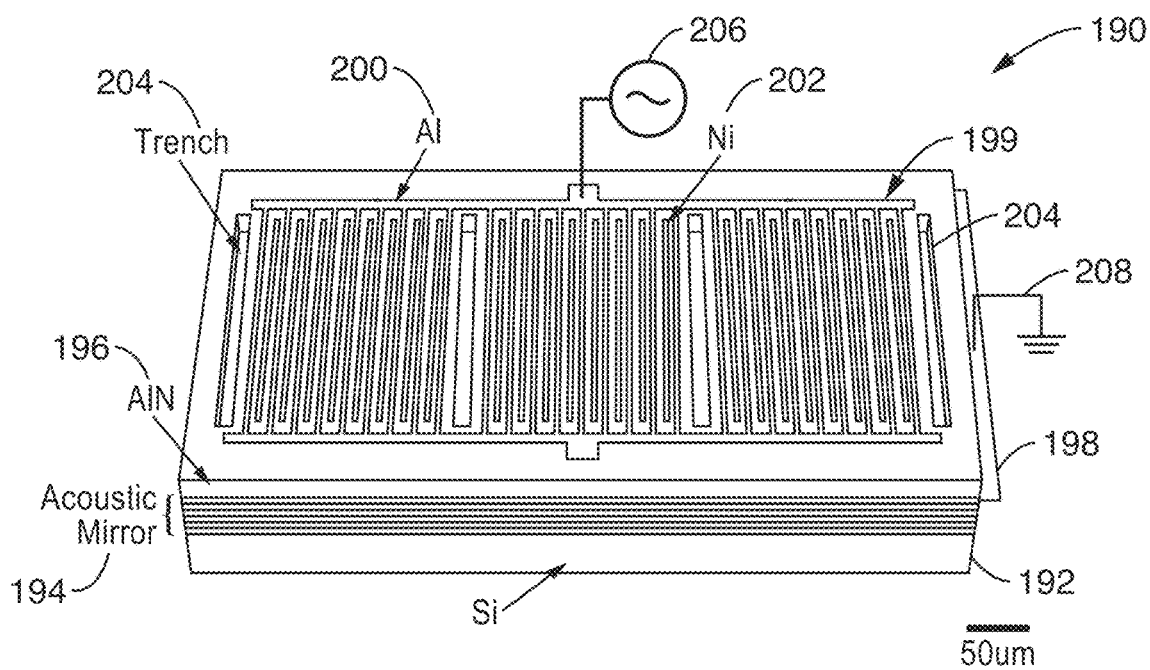
FIG. 9 is a schematic of a shear-horizontal (SH) wave or lamb wave high density mode multiferroic antenna according to an embodiment of the present disclosure.
Figure 10:
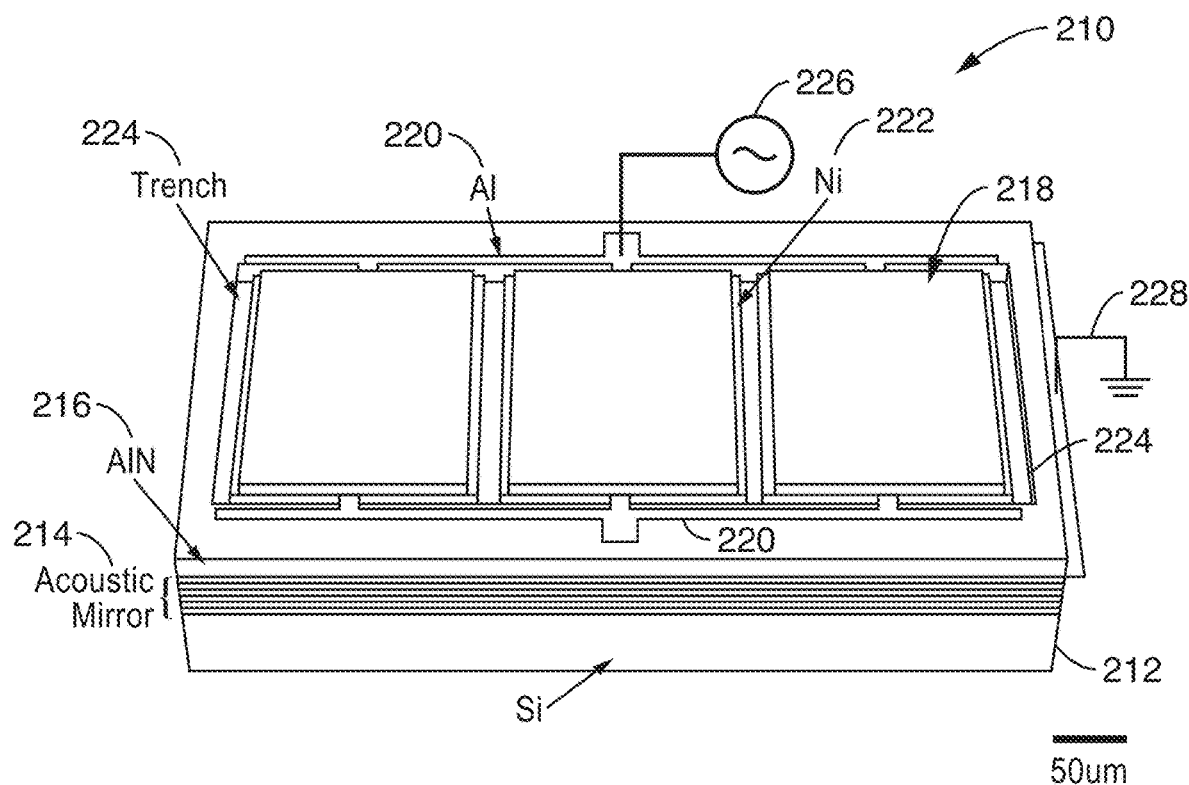
FIG. 10 is a schematic of a bulk acoustic wave (BAW) solidly mounted resonator multiferroic antenna according to an embodiment of the present disclosure.

FIG. 8 through FIG. 10 illustrate example embodiments 170, 190 and 210 of a shear-horizontal/lamb wave multiferroic antenna design in FIG. 8, a shear-horizontal/lamb wave high density mode multiferroic antenna design in FIG. 9, and a bulk acoustic wave (BAW) solidly mounted resonator multiferroic antenna design in FIG. 10.

Although different, each of these designs employ the same working principle, which is to employ mechanical waves to oscillate the magnetic dipoles in a magnetic material to generate electromagnetic (EM) waves, and vice versa. The mechanical wave is generated and detected through piezoelectric components. The EM wave is induced and sensed by magneto-elastic elements. In this way, an electrical signal is transferred into an EM wave. The system is designed to operate at the mechanical resonance frequency of the structure. All three of these multiferroic antenna designs use the aforementioned energy reflecting components to confine the energy and form standing waves in the structure. Their sizes can be modified to match different operating frequencies.

In FIG. 8 a multiferroic antenna 170 is illustrated as a shear-horizontal wave/lamb wave antenna with Si substrate 172, acoustic Bragg mirror stack 174, upper layer of piezoelectric substrate 176, and plate electrode 178 underneath the AlN layer 176. An upper structure 182 is depicted having comb-shaped electrodes 184 (represented material: Al), and magnetoelastic material 186 (represented material: Ni) stripes, and acoustic gratings 180a, 180b (fabricated from high acoustic impedance material, represented material: W) patterned on the top of the piezoelectric substrate (represented material: AlN). The figure is shown with voltage source/sense 188 and ground connection 189.

In FIG. 9 is a multiferroic antenna 190 having a shear-horizontal wave/lamb wave antenna high density mode design shown with Si substrate 192, acoustic Bragg mirror stack 194, upper layer of piezoelectric substrate 196, and plate electrode 198. An upper structure 199 is depicted having comb-shaped electrodes 200 (represented material: Al), and magnetoelastic material 202 (represented material: Ni) stripes pattered on the top of the piezoelectric substrate (represented material: AlN). Between each set of multiferroic antennas in the array are trenches 204, for instance trenches fabricated by etching the piezoelectric substrate and/or the Bragg lattice. The figure is shown with voltage source/sense 206 and ground connection 208.

In FIG. 10 is a multiferroic antenna 210 having a solidly mounted resonator design with Si substrate 212, acoustic mirror stack 214, upper layer of AlN 216, and voltage source/sense and ground 226, 228. Bus-connected electrodes 220 (represented material: Al) are pattered on the top of the piezoelectric substrate (represented material: AlN). The piezoelectric substrate and/or the Bragg acoustic mirror is etched to form trenches 224 which match the shape of the electrodes. On the top of the electrodes, the magnetoelastic material 222 (represented material: Ni) block is patterned.

For these three example designs, the ground electrode is coupled on the back side of the piezoelectric substrate, under which there is a set of layers for a Bragg acoustic mirror formed by alternating high and low acoustic impedance material multilayers. The thickness of each layer, including high/low acoustic impedance materials, piezoelectric substrate electrodes, and magnetoelastic material can be modified independently to match the targeted frequency. The whole system can be patterned on the top of the substrate, such as comprising Si material, or directly on the shell of other devices. In at least one embodiment a biasing structure (not shown) is utilized for applying a bias magnetic field to enhance signal strength. The bias magnetic field can be provided either by a permanent magnet or a tunable electrically magnet. The number of stripes can be modified and the number of antennas on one chip can also be altered, wherein its implementation is not limited to those configurations depicted in the figures. The structure can be periodically patterned on the desired area. The fabrication process consists of photolithography, lift off, e-beam evaporation, magnetron sputtering, and etching in the cleanroom.

It should be appreciated that the present disclosure contemplates the combination of elements from FIG. 8 through 10 as well as other reflective structures and materials used in various combinations to achieve similar signal performance improvements.

This antenna can receive/transmit electromagnetic radiation with extremely small chips/structures. Traditional antennas require geometries that must be on the order of a wavelength to maximize their efficiency. Since the wavelength for the mechanical wave is thousands of times smaller than EM wave, this antenna is roughly a hundredth of a wavelength (of EM wave), which means that it can be used on devices with limited real-estate (i.e., cell phones, UAV, wearable, and bio-implantable devices). In addition, this electrically small antenna can operate at relatively low frequencies (e.g., hundreds of MHz regime) without increasing chip size.

Enhanced by energy reflecting components, this antenna signal has the potential to be the strongest among existing electrically small antennas. Furthermore, the fabrication process only requires the use of mature technologies. The design has a high defect/imperfection tolerance and is easily mass producible.

4. Bragg Mirror and Multiple Frequency Operation

One of the issues with traditional multiferroic antennas is that most of the strain energy does not translate into magnetic energy due to propagation of mechanical waves outside the magnetoelastic zone. In at least one embodiment, the present disclosure incorporates a Bragg acoustic mirror to solve this problem.

A Bragg acoustic mirror is a set of multilayer structures made of alternating layers of high acoustic impedance material and low acoustic impedance material, for example, Tungsten (W) and Silicon Dioxide ($SiO_2$). Table 1 details several potential materials for fabricating Bragg acoustic mirrors.

In addition, in at least one embodiment the Bragg acoustic mirror interoperates with other elements of the design toward creating a multiband multiferroic antenna array, that is to say a multiferroic antenna array having different resonant frequencies, thus expanding the antenna array's bandwidth to wide bandwidths or even ultra-wide bandwidths.

Achieving ultra-wide bandwidth antennas requires electrically small antenna elements to form an antenna array. A multiferroic antenna is the best suitable antenna element for airborne platforms because it can avoid platform effects and it is low-profile. The present disclosure describes a multiferroic antenna with energy reflecting components, including the Bragg acoustic mirror and one or more gratings.

Figure 11A:
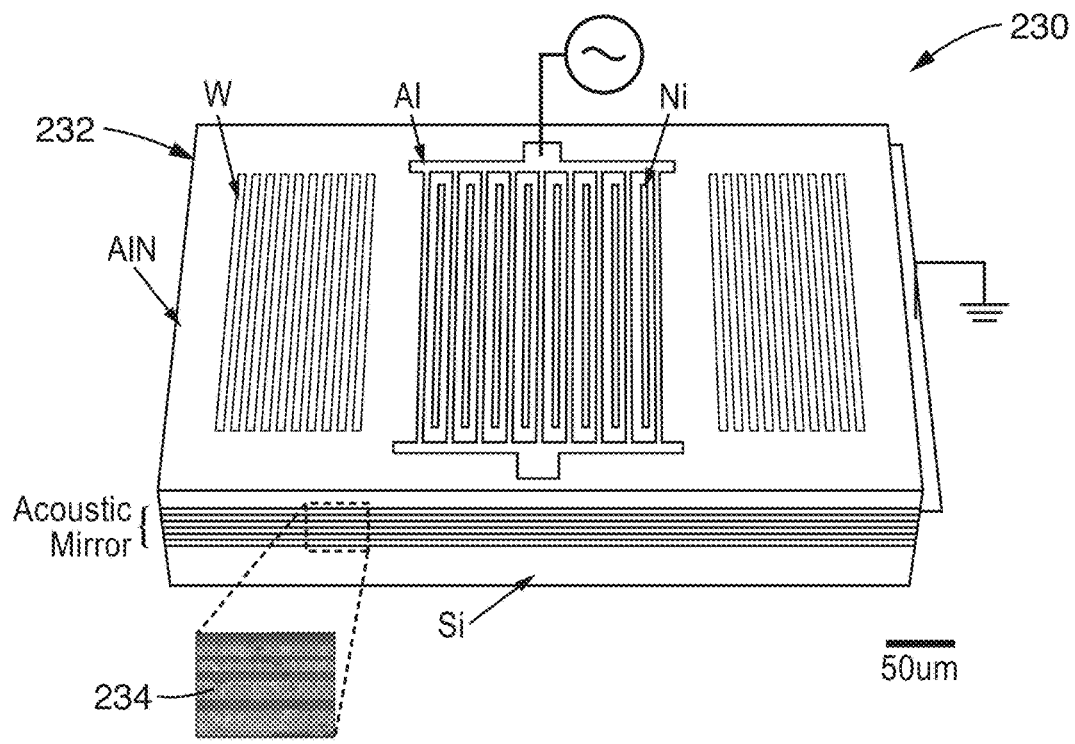
FIG. 11A through FIG. 11D are schematics and characteristics of a multiferroic antenna according to an embodiment of the present disclosure.

FIG. 11A through FIG. 11D illustrate an example embodiment 230, 240, 250, 260 of a multiferroic antenna structure and characteristics. In FIG. 11A is seen a structure diagram of an embodiment 230 of this multiferroic antenna. The antenna 232 is fabricated with magnetoelastic material, for example Nickel and FeGaB, and incorporates micro elements and comb-shaped electrodes. Surrounding the magnetoelastic material micro elements and comb-shaped electrodes there are acoustic gratings and Bragg acoustic mirror 234 to reflect the acoustic energy to form a standing wave and prevent energy dissipation. The magnetoelastic material micro elements, comb-shaped electrodes and acoustic gratings are on the top of AlN, which is piezoelectric.

At the bottom of the AlN layer there is a global ground electrode. Below the ground electrodes there is a Bragg acoustic mirror 234 made of high acoustic impedance material and low acoustic impedance material multilayer. In the example embodiment, these structures are on top of a substrate (e.g., Silicon), although they may be on the skin of an airborne platform directly, or some other structure.

Figure 11B:
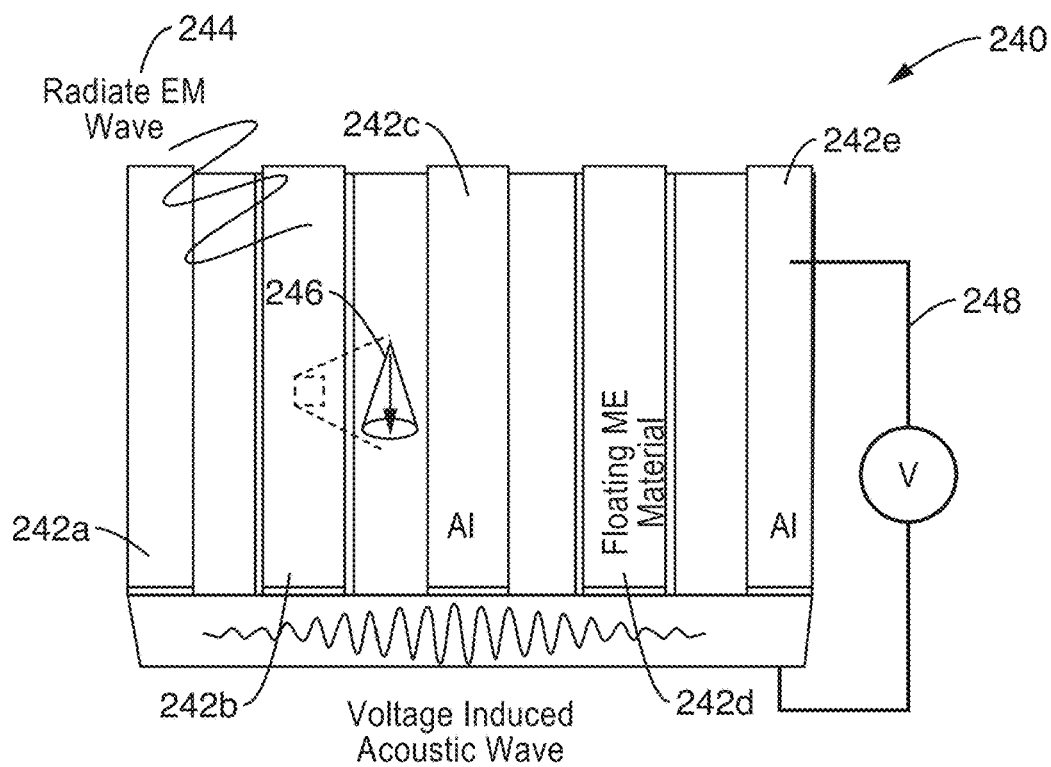

In FIG. 11B depicts the working principle 240 of the multiferroic antenna with strips 242*a* through 242*e*, comprising alternating electrodes and magnetoelastic (ME) material. Element 242*d* is a floating ME material shown as islands between electrodes. Oscillation of magnetoelastic material micro elements excited by a free space electromagnetic wave 244 is detected 246 by the comb-shaped arrays of metallic electrodes through the out-of-plane electrical field which generates output voltage 248.

Figure 11C:
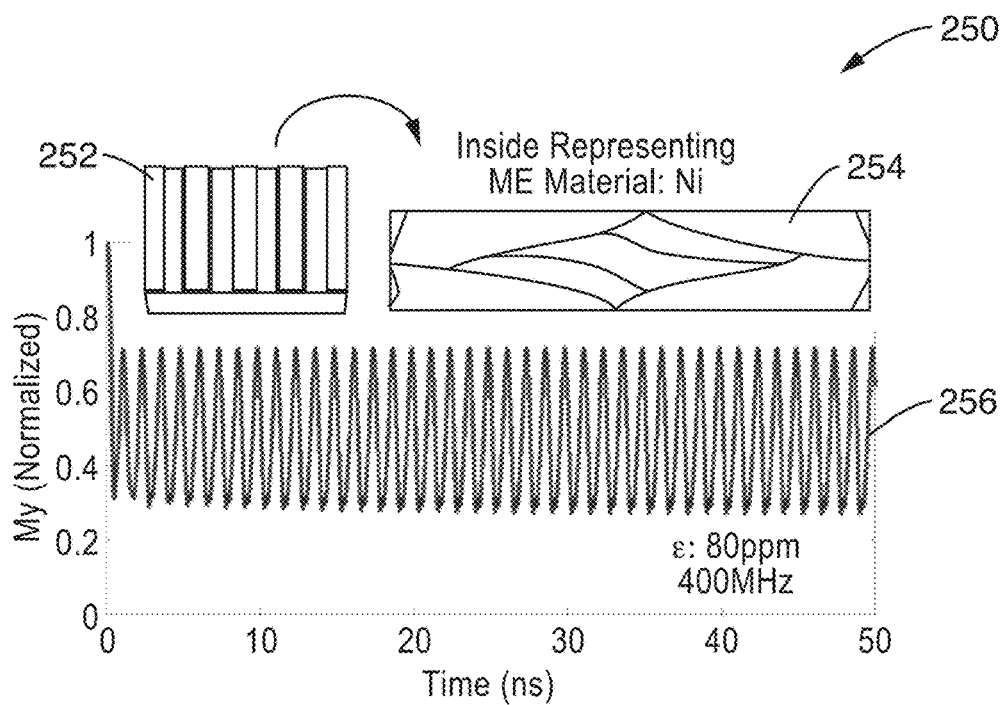

In FIG. 11C characteristics 250 are seen showing a portion of the antenna 252, the inside 254 of floating ME material and 256 representing a plot of magnetic state in the magnetoelastic material (e.g., Nickel). Diagram of cross section 254 was originally in multiple colors depicting the direction of magnetization but has been rendered to a line drawing to comport with patent office drawing guidelines. In the plot 256, the x axis is time, and the y axis is the normalized magnetic component on the y direction. This strain input is about 80 micro strains (ppm) oscillating at 400 MHz. This strain input is obtained from a finite element model with −10 dBm input. Under this input, the strain on the magnetic elements will be 80 macrostrain (ppm). At the same time, magnetic components change will from 0.3 to 0.7 (normalized), which is a 20 percent change. All the data is calculated from a finite difference simulation implemented using the commercial software MuMax.

Figure 11D:
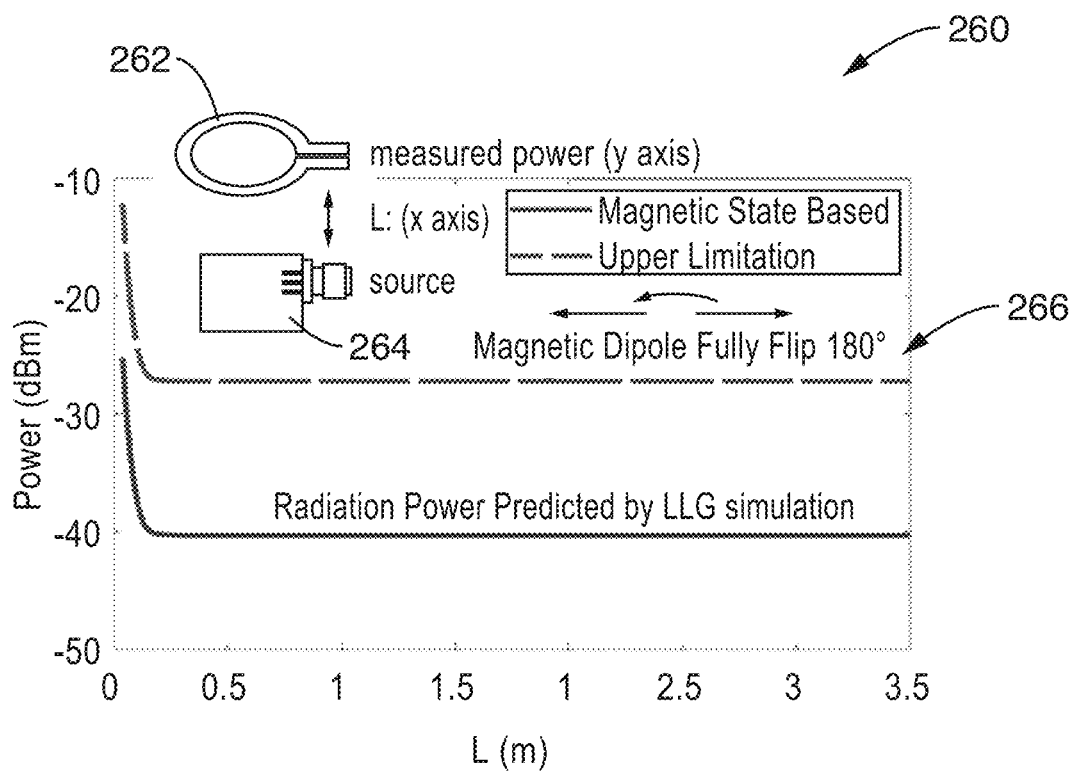

In FIG. 11D is shown 260 the test setup and expected radiation power predicted by dipole-dipole calculation if the antenna's size is 2 cm*2 cm. A depiction of the source 264 and measured power 262 setup is shown. If it is considered that the magnetic dipole is rotating, then the far-field radiation power as seen in plot 266 will be about −27 dBm, as shown by the upper plot line. This is also the upper limit of the radiation power for an antenna size of 2 cm*2 cm and the example utilizes Nickel as the magnetoelastic material. If we use other material like FeGaB, the radiation power can be improved quadratically. The lower line depicts radiation power if calculated according to the magnetic state change in FIG. 11C, then the radiation power is estimated be around −40 dBm. If the antenna's area is increased, the radiation power will increase quadratically with the increase in area.

The calculation of predicted radiation power is briefly discussed. Continuous circular rotation of the magnetization vector in a disk, which is constant in magnitude, can be conceptualized as the linear superposition of two oscillating magnetic dipoles. Assuming the superposition of horizontal Hertzian dipoles placed 90 degrees apart and oscillating 90 degrees out of phase the component the total magnetic dipole moment of a turnstile antenna lying on the x-y plane can be written as:

$$m = m_o(x+iy)e^{-i\omega t}$$

The far field electric and magnetic field components are given as:

$$E = -\frac{Zk^2}{4\pi r}e^{i(kr-\omega t)}(r \times m_o)$$

$$H = -\frac{1}{Z}(E \times r)$$

where $$Z = \sqrt{\frac{\mu_0}{\varepsilon_o}} \text{ and } k = \frac{w}{c},$$

with c being the speed of light.

In spherical coordinates (r, θ, φ) we have:

$$E = -\frac{Zk^2 m_o}{4\pi r}e^{i(kr-\omega t)}(r \times x + ir \times y)$$

$$= -\frac{Zk^2 m_o}{4\pi r}e^{i(kr-\omega t)}[\sin\varphi e_\varphi + \cos\theta\cos\varphi e_\varphi + i(\cos\varphi e_\theta + \cos\theta\sin\varphi e_\varphi)]$$

$$E = -\frac{Zk^2 m_o}{4\pi r}e^{i(kr-\omega t)}[(\sin\varphi - i\cos\varphi)e_\varphi + \cos\theta(\cos\varphi + i\sin\varphi)e_\varphi]$$

and $$H = -\frac{1}{Z}(E \times r)$$

$$= \frac{k^2 m_o}{4\pi r}e^{i(kr-\omega t)}[(\sin\varphi - i\cos\varphi)e_\theta \times e_r + \cos\theta(\cos\varphi + i\sin\varphi)e_\varphi \times e_r] \Rightarrow$$

$$H = \frac{k^2 m_o}{4\pi r}e^{i(kr-\omega t)}[-(\sin\varphi - i\cos\varphi)e_\varphi + \cos\theta(\cos\varphi + i\sin\varphi)e_\theta]$$

The time time-averaged power radiated is then written as:

$$\frac{dP}{d\Omega} = \frac{Zk^4}{32\pi^2}|(r \times m) \times r|^2 = \frac{Zk^4}{32\pi}|m|^2\sin^2\theta$$

And, finally the total power radiated is given as:

$$\langle P \rangle = \frac{Zk^4}{12\pi}|m|^2 = \frac{\mu_0 \omega^4}{12\pi c^3}|m|^2$$

Figure 12:
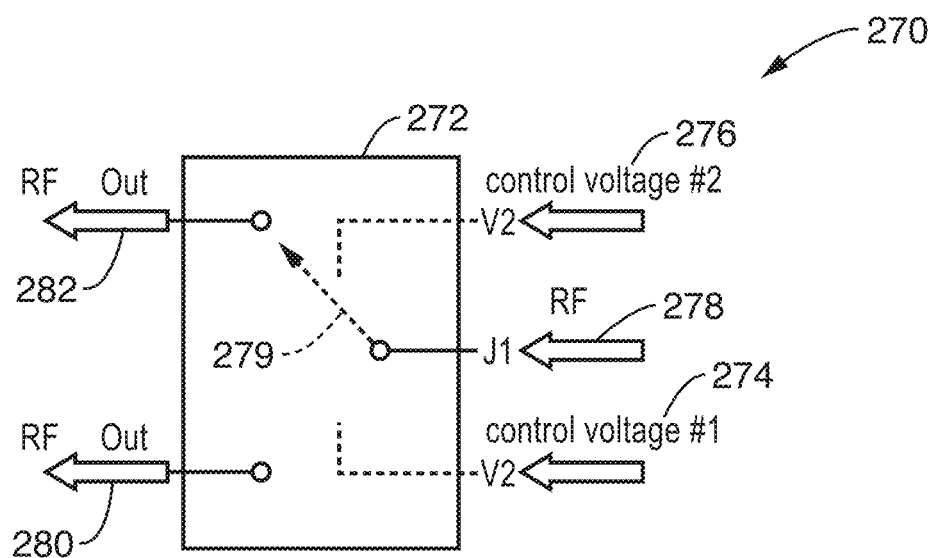
FIG. 12 is a schematic of a switching circuit for operating arrays of multiferroic antennas in a time varying manner according to an embodiment of the present disclosure.

FIG. 12 illustrates a mechanism for interoperating with the multiferroic antenna in a time varying antenna embodiment, exemplified using a switched antenna circuit 270. Switch 272 depicts three different inputs received at an input side as a first control voltage 274, second control voltage 276 and RF voltage 278. The RF voltage carries the information for different frequencies. The RF can be switched 279 between a first RF Out 280 and a second RF Out 282 which is connected to different multiferroic antennas that can operate at different frequency ranges. It should be appreciated that the present disclosure is not limited to using two output switching but may utilize multiway (n-way) switching with any desired number of outputs (and inputs), using any desired form of switching. Because the antenna relies on mechanical resonance, even after the input stops being received, the antenna can still output electromagnetic waves for several micro seconds. Incorporated with fast switches, several antennas that can operate under different frequencies and can radiate together are combined in order to expand the frequency range of the whole antenna system to reach broad band radiation.

Figure 13A:
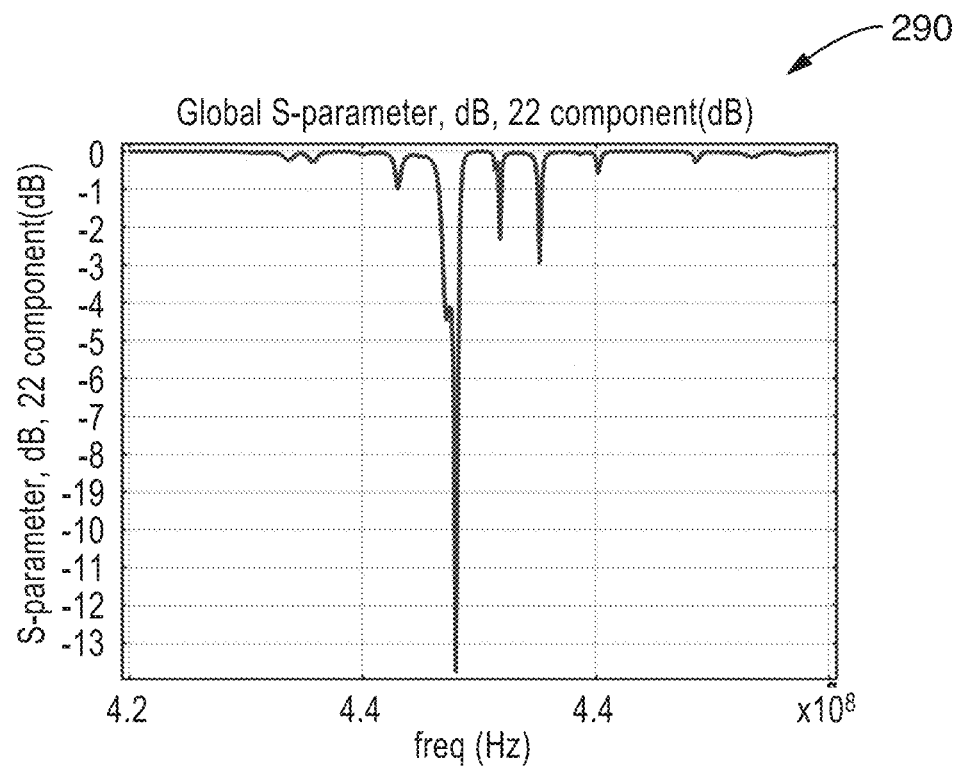
FIG. 13A and FIG. 13B are plots of return loss and strain of a multiferroic antenna operating according to an embodiment of the present disclosure.
Figure 13B:
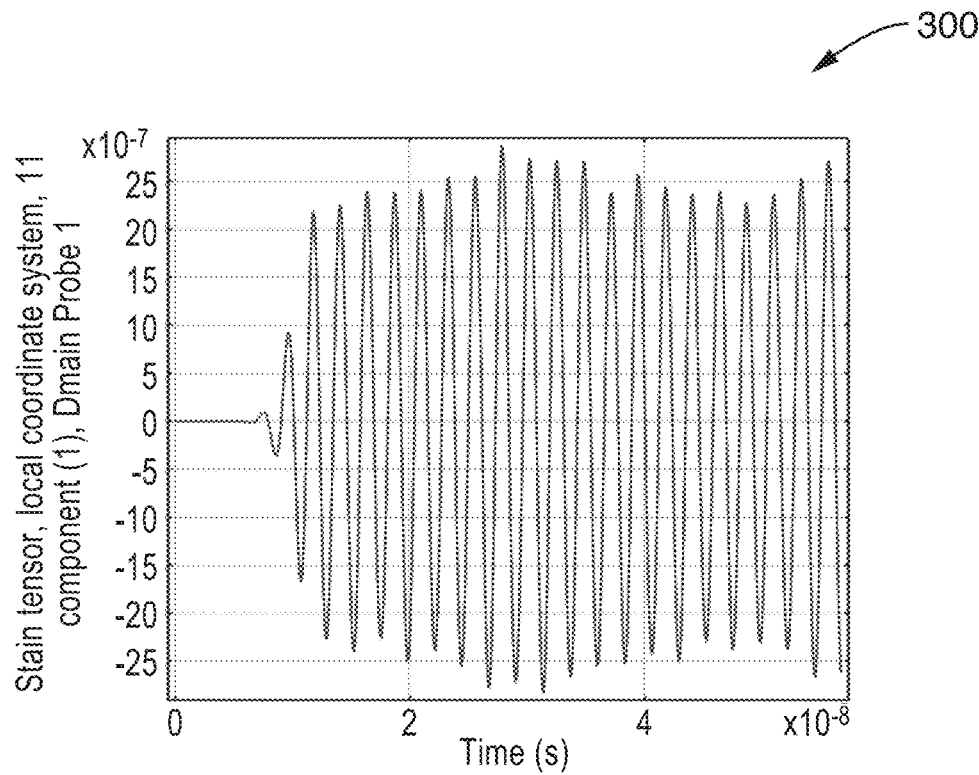

FIG. 13A and FIG. 13B depict simulation results 290, 300 with a finite element model that consists of electrostatics and solid mechanics modules by solving the equations:

$$\varepsilon_{el} = s_E:\sigma + d^t \cdot E$$

$$D = d:\sigma + e_\sigma \cdot E$$

where σ is the stress tensor, E is the electric field vector, $s_E$ is the piezoelectric compliance matrix measured under constant electric fields, d and $d^t$ are the piezoelectric coupling matrix and its transpose, and $e_\sigma$ is the electric permittivity matrix measured under constant stress.

In FIG. 13A a plot is shown 290 depicting return loss (S22) in the frequency domain. The x axis shows the frequency range between 420 MHz to 450 MHz while the y axis shows the return loss in dB scale. For the first design, the antenna elements can resonate at 434 MHz and the return loss can reach −13.7 dB. By changing the antenna's electrode width and other geometry parameters, the antenna's resonant frequency can be modified as desired. In this way, antenna elements can be designed from 340 MHz to 400 MHz to reach the goal for wideband.

In FIG. 13B is a plot 300 of simulation results for strain in the time domain on the magnetoelastic material elements. The x axis shows the time range from 0 to 50 nanoseconds while the y axis shows the strain. Here, a pulse with a center frequency of 434 MHz is applied for 10 nanoseconds. However, the strain oscillation continues and will not decay significantly until time reaches 50 nanoseconds. This indicates that the antenna can still radiate an electromagnetic wave even after the RF input is cut off, which makes it possible for integration with switching mechanisms toward achieving multiband operation.

5. General Scope of Embodiments

From the description herein, it will be appreciated that the present disclosure encompasses multiple embodiments which include, but are not limited to, the following:

A multiferroic radio frequency antenna apparatus, comprising: (a) a piezoelectric substrate; (b) at least one pair of electrodes coupled to said piezoelectric substrate; and (c) a plurality of magnetoelastic and/or magnetostrictive resonators coupled to said piezoelectric substrate; (d) wherein said electrodes in combination with piezoelectric substrate convert between radio frequency electrical signals input at the electrodes to mechanical waves in the piezoelectric substrate, or from mechanical waves in the piezoelectric substrate to radio frequency electrical signal from the electrodes; (e) wherein said magnetoelastic and/or magnetostrictive resonators in combination with said piezoelectric substrate convert between radio frequency electromagnetic waves input at said magnetoelastic and/or magnetostrictive resonators to mechanical waves in said piezoelectric substrate, or from mechanical waves in said piezoelectric substrate to radio frequency electromagnetic waves from said magnetoelastic and/or magnetostrictive resonators; and (f) wherein said antenna apparatus performs reception in response to converting radio frequency electromagnetic radiation into radio frequency electrical signals, and performs transmission in response to converting radio frequency electrical signals into radio frequency electromagnetic radiation.

A multiferroic radio frequency antenna apparatus, comprising: (a) a piezoelectric substrate; (b) at least one pair of electrodes, coupled to said piezoelectric substrate, and configured for converting between an electrical signal at the electrodes to mechanical waves in the piezoelectric substrate, or from mechanical waves in the piezoelectric substrate to electrical signals at the electrodes; and (c) a plurality of magnetoelastic and/or magnetostrictive resonators, coupled to said piezoelectric substrate, and configured for converting between mechanical waves in the piezoelectric substrate to electromagnetic waves from the magnetoelastic and/or magnetostrictive resonators, or from electromagnetic waves received by the magnetoelastic and/or magnetostrictive resonators into mechanical waves in the piezoelectric substrate; (d) wherein said piezoelectric substrate interfaces between said at least one pair electrodes and said plurality of magnetoelastic and/or magnetostrictive resonators to transmit electromagnetic signals by converting radio frequency electrical signals applied at said electrodes into electromagnetic waves from the magnetoelastic and/or magnetostrictive resonators, and to receive electromagnetic signals by converting electromagnetic waves received at said magnetoelastic and/or magnetostrictive into radio frequency electrical signals at said electrodes.

A multiferroic radio frequency antenna apparatus, comprising: (a) a piezoelectric substrate; (b) a plurality of magnetoelastic and/or magnetostrictive resonators coupled to said piezoelectric substrate; (c) at least one pair of electrodes, having a first electrode coupled to a first surface plane of said piezoelectric substrate, and a second electrode coupled to a second surface plane of said piezoelectric substrate; (d) wherein in receive mode said plurality of magnetoelastic and/or magnetostrictive resonators create mechanical waves in response to being excited into magnetic oscillation by receiving electromagnetic radiation, and these mechanical waves coupled to the piezoelectric substrate cause it to generate an electrical output signal at said electrodes; and (e) wherein in transmit mode an electrical signal coupled through said electrodes to the piezoelectric substrate induces mechanical waves directed to said plurality of magnetoelastic and/or magnetostrictive resonators which are excited into magnetic oscillation to output electromagnetic waves.

A multiferroic radio frequency antenna apparatus, comprising: a piezoelectric substrate; at least one pair of electrodes coupled to said piezoelectric substrate; and a plurality of magnetoelastic and/or magnetostrictive resonators coupled to said piezoelectric substrate; wherein said electrodes in combination with piezoelectric substrate convert between radio frequency electrical signals input at the electrodes to mechanical waves in the piezoelectric substrate, or from mechanical waves in the piezoelectric substrate to radio frequency electrical signal from the electrodes; wherein said magnetoelastic and/or magnetostrictive resonators in combination with said piezoelectric substrate convert between radio frequency electromagnetic waves input at said magnetoelastic and/or magnetostrictive resonators to mechanical waves in said piezoelectric substrate, or from mechanical waves in said piezoelectric substrate to radio frequency electromagnetic waves from said magnetoelastic and/or magnetostrictive resonators; and wherein said antenna apparatus performs reception in response to converting radio frequency electromagnetic radiation into radio frequency electrical signals, and performs transmission in response to converting radio frequency electrical signals into radio frequency electromagnetic radiation.

A multiferroic radio frequency antenna apparatus, comprising: a piezoelectric substrate; at least one pair of electrodes, coupled to said piezoelectric substrate, and configured for converting between an electrical signal at the electrodes to mechanical waves in the piezoelectric substrate, or from mechanical waves in the piezoelectric substrate to electrical signals at the electrodes; and a plurality of magnetoelastic and/or magnetostrictive resonators, coupled to said piezoelectric substrate, and configured for converting between mechanical waves in the piezoelectric substrate to electromagnetic waves from the magnetoelastic and/or magnetostrictive resonators, or from electromagnetic waves received by the magnetoelastic and/or magnetostrictive resonators into mechanical waves in the piezoelectric substrate; wherein said piezoelectric substrate interfaces between said at least one pair electrodes and said plurality of magnetoelastic and/or magnetostrictive resonators to transmit electromagnetic signals by converting radio frequency electrical signals applied at said electrodes into electromagnetic waves from the magnetoelastic and/or magnetostrictive resonators, and to receive electromagnetic signals by converting electromagnetic waves received at said magnetoelastic and/or magnetostrictive into radio frequency electrical signals at said electrodes.

A multiferroic radio frequency antenna apparatus, comprising: a piezoelectric substrate; a plurality of magnetoelastic and/or magnetostrictive resonators coupled to said piezoelectric substrate; at least one pair of electrodes, having a first electrode coupled to a first surface plane of said piezoelectric substrate, and a second electrode coupled to a second surface plane of said piezoelectric substrate; wherein in receive mode said plurality of magnetoelastic and/or magnetostrictive resonators create mechanical waves in response to being excited into magnetic oscillation by receiving electromagnetic radiation, and these mechanical waves coupled to the piezoelectric substrate cause it to generate an electrical output signal at said electrodes; and wherein in transmit mode an electrical signal coupled through said electrodes to the piezoelectric substrate induces mechanical waves directed to said plurality of magnetoelastic and/or magnetostrictive resonators which are excited into magnetic oscillation to output electromagnetic waves.

A method of generating electromagnetic radiation at radio frequencies into free space, comprising: utilizing magnetoelastic and/or magnetostrictive material as resonators to create or receive mechanical waves across a piezoelectric substrate to electrodes upon which an electrical signal is created or received.

The apparatus or method of any preceding embodiment, wherein said antenna apparatus is configured for transmitting or receiving radio frequency electromagnetic radiation.

The apparatus or method of any preceding embodiment, wherein dynamic magnetic flux current oscillations in said plurality of magnetoelastic and/or magnetostrictive resonators are used as a fundamental source for detecting or radiating radio frequency electromagnetic waves.

The apparatus or method of any preceding embodiment, wherein wavelengths of the mechanical waves in said piezoelectric substrate are orders of magnitude smaller than wavelengths of the radio frequency electromagnetic waves which are received or transmitted from said magnetoelastic and/or magnetostrictive resonators, allowing said antenna apparatus to be orders of magnitude smaller than a conventional electromagnetic antenna operating at an identical radio frequency.

The apparatus or method of any preceding embodiment, wherein said electrodes comprise a first electrode coupled to a first surface plane of said piezoelectric substrate, and a second electrode coupled to a second surface plane of said piezoelectric substrate.

The apparatus or method of any preceding embodiment, wherein said first electrode or said second electrode is configured in a pattern with open spaces within each of which are disposed an array of magnetoelastic and/or magnetostrictive resonators.

The apparatus or method of any preceding embodiment, wherein said piezoelectric substrate uses dynamic strain in converting between electrical signals and mechanical waves.

The apparatus or method of any preceding embodiment, wherein said mechanical waves comprise a shear wave.

The apparatus or method of any preceding embodiment, wherein said plurality of magnetoelastic and/or magnetostrictive resonators are configured to transfer between electromagnetic waves and mechanical waves in response to their natural frequency.

The apparatus or method of any preceding embodiment, wherein size, shape, and distance relationships between said plurality of magnetoelastic and/or magnetostrictive resonators and said electrodes determine the resonant parameters.

The apparatus or method of any preceding embodiment, wherein said electrodes comprise a detector for measuring voltage and generating an output to a grounded coplanar waveguide.

The apparatus or method of any preceding embodiment, wherein said mechanical waves comprise a shear wave, or a shear-horizontal wave, or a lamb wave, or any combination of shear wave, shear horizontal wave and lamb wave.

The apparatus or method of any preceding embodiment, further comprising incorporating islands of floating magnetoelastic (ME) material between at least one pair of electrodes.

The apparatus or method of any preceding embodiment, further comprising an antenna switching circuit configured for switching m radio-frequency sources or inputs, between n different multiferroic antennas in response to receiving at least one control voltage in a time varying antenna, wherein value n is larger than m.

The apparatus or method of any preceding embodiment, wherein at least a portion of said n different multiferroic antennas operate at different frequency ranges, toward broadening frequency range of said multiferroic radio frequency antenna apparatus to reach broad band radiation The apparatus or method of any preceding embodiment, further comprising incorporating mechanical acoustic energy reflecting mechanisms toward enhancing mechanical wave strength and/or electrical signal strength.

The apparatus or method of any preceding embodiment, wherein said mechanical acoustic energy reflecting mechanisms are selected from the group of mechanical acoustic energy reflecting mechanisms consisting of Bragg acoustic mirrors, acoustic gratings, trenches, and air cavities, toward enhancing mechanical wave strength and/or electrical signal strength.

The apparatus or method of any preceding embodiment, wherein said mechanical waves comprise a shear wave, or a shear-horizontal wave, or a lamb wave, or any combination of shear wave, shear horizontal wave and lamb wave.

The apparatus or method of any preceding embodiment, further comprising incorporating islands of floating magnetoelastic (ME) material between at least one pair of electrodes.

The apparatus or method of any preceding embodiment, further comprising switching n different multiferroic antennas between m radio-frequency sources or inputs, in response to receiving at least one control voltage in controlling a time varying antenna, in which value n is larger than value m.

The apparatus or method of any preceding embodiment, wherein at least a portion of said n different multiferroic antennas are configured for operating at different frequency ranges than one another, toward broadening overall an range of operating frequencies.

The apparatus or method of any preceding embodiment, wherein said antenna apparatus is configured for transmitting or receiving radio frequency electromagnetic radiation.

The apparatus or method of any preceding embodiment, wherein dynamic magnetic flux current oscillations in said plurality of magnetoelastic and/or magnetostrictive resonators are used as a fundamental source for detecting or radiating radio frequency electromagnetic waves.

The apparatus or method of any preceding embodiment, wherein wavelengths of the mechanical waves in said piezoelectric substrate are orders of magnitude smaller than wavelengths of the radio frequency electromagnetic waves which are received or transmitted from said magnetoelastic and/or magnetostrictive resonators, allowing said antenna apparatus to be orders of magnitude smaller than a conventional electromagnetic antenna operating at an identical radio frequency.

The apparatus or method of any preceding embodiment, wherein said electrodes have a first electrode coupled to a first surface plane of said piezoelectric substrate, and a second electrode coupled to a second surface plane of said piezoelectric substrate.

The apparatus or method of any preceding embodiment, wherein said first electrode or said second electrode is configured in a pattern with open spaces within each of which are disposed an array of magnetoelastic and/or magnetostrictive resonators.

The apparatus or method of any preceding embodiment, wherein said piezoelectric substrate uses dynamic strain in converting between electrical signals and mechanical waves.

The apparatus or method of any preceding embodiment, wherein said mechanical waves comprises a shear wave.

The apparatus or method of any preceding embodiment, wherein said plurality of magnetoelastic and/or magnetostrictive resonators are configured to transfer between electromagnetic waves and mechanical waves in response to their natural frequency.

The apparatus or method of any preceding embodiment, wherein size, shape, and distance relationships between said plurality of magnetoelastic and/or magnetostrictive resonators and said electrodes determine the resonant parameters.

The apparatus or method of any preceding embodiment, wherein said electrodes comprise a detector for measuring voltage and generating an output to a grounded coplanar waveguide.

As used herein, the singular terms "a," "an," and "the" may include plural referents unless the context clearly dictates otherwise. Reference to an object in the singular is not intended to mean "one and only one" unless explicitly so stated, but rather "one or more."

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

Phrasing constructs, such as "A, B and/or C", within the present disclosure describe where either A, B, or C can be present, or any combination of items A, B and C. Phrasing constructs indicating, such as "at least one of" followed by listing group of elements indicates that at least one of these group elements is present, which includes any possible combination of these listed elements as applicable.

References in this specification referring to "an embodiment", "at least one embodiment" or similar embodiment wording indicates that a particular feature, structure, or characteristic described in connection with a described embodiment is included in at least one embodiment of the present disclosure. Thus, these various embodiment phrases are not necessarily all referring to the same embodiment, or to a specific embodiment which differs from all the other embodiments being described. The embodiment phrasing should be construed to mean that the particular features, structures, or characteristics of a given embodiment may be combined in any suitable manner in one or more embodiments of the disclosed apparatus, system or method.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A multiferroic radio frequency antenna apparatus, comprising:
   a piezoelectric substrate;
   at least one pair of electrodes coupled to said piezoelectric substrate; and
   a plurality of magnetoelastic and/or magnetostrictive resonators coupled to said piezoelectric substrate;
   wherein said electrodes in combination with piezoelectric substrate convert between radio frequency electrical signals input at the electrodes to mechanical waves in the piezoelectric substrate, or from mechanical waves in the piezoelectric substrate to radio frequency electrical signal from the electrodes;
   wherein said magnetoelastic and/or magnetostrictive resonators in combination with said piezoelectric substrate convert between radio frequency electromagnetic waves input at said magnetoelastic and/or magnetostrictive resonators to mechanical waves in said piezoelectric substrate, or from mechanical waves in said piezoelectric substrate to radio frequency electromagnetic waves from said magnetoelastic and/or magnetostrictive resonators;
   wherein said antenna apparatus performs reception in response to converting radio frequency electromagnetic radiation into radio frequency electrical signals, and performs transmission in response to converting radio frequency electrical signals into radio frequency electromagnetic radiation; and
   wherein dynamic magnetic flux current oscillations in said plurality of magnetoelastic and/or magnetostrictive resonators are used as a fundamental source for detecting or radiating radio frequency electromagnetic waves.

2. A multiferroic radio frequency antenna apparatus, comprising:
   a piezoelectric substrate;
   at least one pair of electrodes, coupled to said piezoelectric substrate, and configured for converting between an electrical signal at the electrodes to mechanical waves in the piezoelectric substrate, or from mechanical waves in the piezoelectric substrate to electrical signals at the electrodes; and
   a plurality of magnetoelastic and/or magnetostrictive resonators, coupled to said piezoelectric substrate, and configured for converting between mechanical waves in the piezoelectric substrate to electromagnetic waves from the magnetoelastic and/or magnetostrictive resonators, or from electromagnetic waves received by the magnetoelastic and/or magnetostrictive resonators into mechanical waves in the piezoelectric substrate;
   wherein said piezoelectric substrate interfaces between said at least one pair electrodes and said plurality of magnetoelastic and/or magnetostrictive resonators to transmit electromagnetic signals by converting radio frequency electrical signals applied at said electrodes into electromagnetic waves from the magnetoelastic and/or magnetostrictive resonators, and to receive electromagnetic signals by converting electromagnetic waves received at said magnetoelastic and/or magnetostrictive into radio frequency electrical signals at said electrodes; and wherein dynamic magnetic flux current oscillations in said plurality of magnetoelastic and/or magnetostrictive resonators are used as a fundamental source for detecting or radiating radio frequency electromagnetic waves.

3. A multiferroic radio frequency antenna apparatus, comprising:

a piezoelectric substrate;

at least one pair of electrodes coupled to said piezoelectric substrate; and a plurality of magnetoelastic and/or magnetostrictive resonators coupled to said piezoelectric substrate;

wherein said electrodes in combination with piezoelectric substrate convert between radio frequency electrical signals input at the electrodes to mechanical waves in the piezoelectric substrate, or from mechanical waves in the piezoelectric substrate to radio frequency electrical signal from the electrodes;

wherein said magnetoelastic and/or magnetostrictive resonators in combination with said piezoelectric substrate convert between radio frequency electromagnetic waves input at said magnetoelastic and/or magnetostrictive resonators to mechanical waves in said piezoelectric substrate, or from mechanical waves in said piezoelectric substrate to radio frequency electromagnetic waves from said magnetoelastic and/or magnetostrictive resonators;

wherein said antenna apparatus performs reception in response to converting radio frequency electromagnetic radiation into radio frequency electrical signals, and performs transmission in response to converting radio frequency electrical signals into radio frequency electromagnetic radiation; and wherein wavelengths of the mechanical waves in said piezoelectric substrate are orders of magnitude smaller than wavelengths of the radio frequency electromagnetic waves which are received or transmitted from said magnetoelastic and/or magnetostrictive resonators, allowing said antenna apparatus to be orders of magnitude smaller than a conventional electromagnetic antenna operating at an identical radio frequency.

4. A multiferroic radio frequency antenna apparatus, comprising:

a piezoelectric substrate;

at least one pair of electrodes, coupled to said piezoelectric substrate, and configured for converting between an electrical signal at the electrodes to mechanical waves in the piezoelectric substrate, or from mechanical waves in the piezoelectric substrate to electrical signals at the electrodes; and a plurality of magnetoelastic and/or magnetostrictive resonators, coupled to said piezoelectric substrate, and configured for converting between mechanical waves in the piezoelectric substrate to electromagnetic waves from the magnetoelastic and/or magnetostrictive resonators, or from electromagnetic waves received by the magnetoelastic and/or magnetostrictive resonators into mechanical waves in the piezoelectric substrate;

wherein said piezoelectric substrate interfaces between said at least one pair electrodes and said plurality of magnetoelastic and/or magnetostrictive resonators to transmit electromagnetic signals by converting radio frequency electrical signals applied at said electrodes into electromagnetic waves from the magnetoelastic and/or magnetostrictive resonators, and to receive electromagnetic signals by converting electromagnetic waves received at said magnetoelastic and/or magnetostrictive into radio frequency electrical signals at said electrodes; and wherein wavelengths of the mechanical waves in said piezoelectric substrate are orders of magnitude smaller than wavelengths of the radio frequency electromagnetic waves which are received or transmitted from said magnetoelastic and/or magnetostrictive resonators, allowing said antenna apparatus to be orders of magnitude smaller than a conventional electromagnetic antenna operating at an identical radio frequency.

5. A multiferroic radio frequency antenna apparatus, comprising:

a piezoelectric substrate;

at least one pair of electrodes coupled to said piezoelectric substrate;

islands of floating magnetoelastic (ME) material between at least one pair of said electrodes; and a plurality of magnetoelastic and/or magnetostrictive resonators coupled to said piezoelectric substrate;

wherein said electrodes in combination with piezoelectric substrate convert between radio frequency electrical signals input at the electrodes to mechanical waves in the piezoelectric substrate, or from mechanical waves in the piezoelectric substrate to radio frequency electrical signal from the electrodes;

wherein said magnetoelastic and/or magnetostrictive resonators in combination with said piezoelectric substrate convert between radio frequency electromagnetic waves input at said magnetoelastic and/or magnetostrictive resonators to mechanical waves in said piezoelectric substrate, or from mechanical waves in said piezoelectric substrate to radio frequency electromagnetic waves from said magnetoelastic and/or magnetostrictive resonators; and wherein said antenna apparatus performs reception in response to converting radio frequency electromagnetic radiation into radio frequency electrical signals, and performs transmission in response to converting radio frequency electrical signals into radio frequency electromagnetic radiation.

6. A multiferroic radio frequency antenna apparatus, comprising:

a piezoelectric substrate;

at least one pair of electrodes, coupled to said piezoelectric substrate, and configured for converting between an electrical signal at the electrodes to mechanical waves in the piezoelectric substrate, or from mechanical waves in the piezoelectric substrate to electrical signals at the electrodes;

islands of floating magnetoelastic (ME) material between at least one pair of said electrodes; and a plurality of magnetoelastic and/or magnetostrictive resonators, coupled to said piezoelectric substrate, and configured for converting between mechanical waves in the piezoelectric substrate to electromagnetic waves from the magnetoelastic and/or magnetostrictive resonators, or from electromagnetic waves received by the magnetoelastic and/or magnetostrictive resonators into mechanical waves in the piezoelectric substrate;

wherein said piezoelectric substrate interfaces between said at least one pair electrodes and said plurality of magnetoelastic and/or magnetostrictive resonators to transmit electromagnetic signals by converting radio frequency electrical signals applied at said electrodes into electromagnetic waves from the magnetoelastic and/or magnetostrictive resonators, and to receive electromagnetic signals by converting electromagnetic waves received at said magnetoelastic and/or magnetostrictive into radio frequency electrical signals at said electrodes.

7. A multiferroic radio frequency antenna apparatus, comprising:

a piezoelectric substrate;

at least one pair of electrodes coupled to said piezoelectric substrate;

a plurality of magnetoelastic and/or magnetostrictive resonators coupled to said piezoelectric substrate; and an antenna switching circuit configured for switching m radio-frequency sources or inputs, between n different multiferroic antennas in response to receiving at least one control voltage in a time varying antenna, wherein value n is larger than m;

wherein said electrodes in combination with piezoelectric substrate convert between radio frequency electrical signals input at the electrodes to mechanical waves in the piezoelectric substrate, or from mechanical waves in the piezoelectric substrate to radio frequency electrical signal from the electrodes;

wherein said magnetoelastic and/or magnetostrictive resonators in combination with said piezoelectric substrate convert between radio frequency electromagnetic waves input at said magnetoelastic and/or magnetostrictive resonators to mechanical waves in said piezoelectric substrate, or from mechanical waves in said piezoelectric substrate to radio frequency electromagnetic waves from said magnetoelastic and/or magnetostrictive resonators; and wherein said antenna apparatus performs reception in response to converting radio frequency electromagnetic radiation into radio frequency electrical signals, and performs transmission in response to converting radio frequency electrical signals into radio frequency electromagnetic radiation.

8. A multiferroic radio frequency antenna apparatus, comprising:

a piezoelectric substrate;

at least one pair of electrodes, coupled to said piezoelectric substrate, and configured for converting between an electrical signal at the electrodes to mechanical waves in the piezoelectric substrate, or from mechanical waves in the piezoelectric substrate to electrical signals at the electrodes;

a plurality of magnetoelastic and/or magnetostrictive resonators, coupled to said piezoelectric substrate, and configured for converting between mechanical waves in the piezoelectric substrate to electromagnetic waves from the magnetoelastic and/or magnetostrictive resonators, or from electromagnetic waves received by the magnetoelastic and/or magnetostrictive resonators into mechanical waves in the piezoelectric substrate; and an antenna switching circuit configured for switching m radio-frequency sources or inputs, between n different multiferroic antennas in response to receiving at least one control voltage in a time varying antenna, wherein value n is larger than m;

wherein said piezoelectric substrate interfaces between said at least one pair electrodes and said plurality of magnetoelastic and/or magnetostrictive resonators to transmit electromagnetic signals by converting radio frequency electrical signals applied at said electrodes into electromagnetic waves from the magnetoelastic and/or magnetostrictive resonators, and to receive electromagnetic signals by converting electromagnetic waves received at said magnetoelastic and/or magnetostrictive into radio frequency electrical signals at said electrodes.

9. The apparatus of claim 7 or 8, wherein at least a portion of said n different multiferroic antennas operate at different frequency ranges, toward broadening frequency range of said multiferroic radio frequency antenna apparatus to reach broad band radiation.

10. The apparatus of any of claims 1, 2 or 3-8, wherein said antenna apparatus is configured for transmitting or receiving radio frequency electromagnetic radiation.

11. The apparatus of any of claims 1, 2 or 3-8, wherein said electrodes comprise a first electrode coupled to a first surface plane of said piezoelectric substrate, and a second electrode coupled to a second surface plane of said piezoelectric substrate.

12. The apparatus of any of claims 1, 2 or 3-8, wherein said piezoelectric substrate uses dynamic strain in converting between electrical signals and mechanical waves.

13. The apparatus of any of claims 1, 2 or 3-8, wherein said mechanical waves comprise a shear wave.

14. The apparatus of any of claims 1, 2 or 3-8, wherein said plurality of magnetoelastic and/or magnetostrictive resonators are configured to transfer between electromagnetic waves and mechanical waves in response to their natural frequency.

15. The apparatus of any of claims 1, 2 or 3-8, wherein said electrodes comprise a detector for measuring voltage and generating an output to a grounded coplanar waveguide.

16. The apparatus of any of claims 1, 2 or 3-8, wherein said mechanical waves comprise a shear wave, or a shear-horizontal wave, or a lamb wave, or any combination of shear wave, shear horizontal wave and lamb wave.

* * * * *